US012652819B2

(12) United States Patent
Li et al.

(10) Patent No.: US 12,652,819 B2
(45) Date of Patent: Jun. 9, 2026

---

(54) NITRIDE SEMICONDUCTOR DEVICE

(71) Applicant: GUANGDONG ZHINENG TECHNOLOGIES, CO. LTD., Guangzhou (CN)

(72) Inventors: Zilan Li, Guangzhou (CN); Shuxin Zhang, Guangzhou (CN)

(73) Assignee: GUANGDONG ZHINENG TECHNOLOGIES, CO. LTD., Guangzhou (CN)

( * ) Notice: Subject to any disclaimer, the term of this patent is extended or adjusted under 35 U.S.C. 154(b) by 601 days.

(21) Appl. No.: 18/042,185

(22) PCT Filed: Feb. 8, 2021

(86) PCT No.: PCT/CN2021/075970
§ 371 (c)(1),
(2) Date: Feb. 17, 2023

(87) PCT Pub. No.: WO2022/037028
PCT Pub. Date: Feb. 24, 2022

(65) Prior Publication Data
US 2023/0335631 A1 Oct. 19, 2023

(30) Foreign Application Priority Data
Aug. 17, 2020 (CN) .......................... 202010824843.9

(51) Int. Cl.
*H10D 30/47* (2025.01)
*H10D 30/01* (2025.01)
(Continued)

(52) U.S. Cl.
CPC ......... *H10D 30/477* (2025.01); *H10D 30/015* (2025.01); *H10D 30/475* (2025.01);
(Continued)

(58) Field of Classification Search
CPC .. H10D 30/477; H10D 30/015; H10D 30/475; H10D 62/8503; H10D 30/478;
(Continued)

(56) References Cited

U.S. PATENT DOCUMENTS

2004/0200523 A1* 10/2004 King ....................... H10F 77/16
136/262
2004/0263256 A1* 12/2004 Ishikawa ................. H03F 3/195
330/296
(Continued)

FOREIGN PATENT DOCUMENTS

| CN | 103681830 A | 3/2014 |
| CN | 105679823 A | 6/2016 |
| CN | 110224019 A | 9/2019 |

OTHER PUBLICATIONS

Kuhn, B., and F. Scholz. "An oxygen doped nucleation layer for the growth of high optical quality GaN on sapphire." physica status solidi (a) 188.2 (2001): 629-633. (Year: 2001).*
(Continued)

*Primary Examiner* — Norman D Richards
*Assistant Examiner* — Ethan Edward Cutler
(74) *Attorney, Agent, or Firm* — Seed IP Law Group LLP

(57) ABSTRACT

The present invention relates to a semiconductor device, including: a first channel layer, which includes a first channel region, a first gate doped region, and a second channel region, where the second channel region is located above the first channel region, and the first gate doped region is located between the first channel region and the second channel region; a first barrier layer, where a first heterojunction having a vertical interface is formed between the first channel layer and the first barrier layer, and a vertical 2DEG or 2DHG is formed in the first heterojunction; a first electrode, which is located below the first gate doped region and in electric contact with the 2DEG or 2DHG in the first (Continued)

heterojunction; a second electrode, which is located above the first gate doped region and in electric contact with the 2DEG or 2DHG in the first heterojunction; and a third electrode, which is in electric contact, in the first gate doped region, with the 2DEG or 2DHG in the first heterojunction. The present invention further includes a manufacturing method for a semiconductor device.

29 Claims, 19 Drawing Sheets

(51) Int. Cl.
    *H10D 62/85*      (2025.01)
    *H10P 14/20*      (2026.01)
    *H10P 95/00*      (2026.01)

(52) U.S. Cl.
    CPC ..... *H10D 62/8503* (2025.01); *H10P 14/2905* (2026.01); *H10P 14/2925* (2026.01); *H10P 14/3416* (2026.01); *H10P 95/11* (2026.01)

(58) Field of Classification Search
    CPC .. H10D 62/149; H10D 62/307; H10D 62/105; H10D 30/4732; H10D 64/512; H01L 21/02381; H01L 21/0243; H01L 21/0254; H01L 21/7806
    See application file for complete search history.

(56) References Cited

U.S. PATENT DOCUMENTS

| | | | |
|---|---|---|---|
| 2008/0303033 A1* | 12/2008 | Brandes | H10H 20/0137 |
| | | | 438/47 |
| 2012/0086049 A1 | 4/2012 | Hwang et al. | |
| 2013/0141156 A1 | 6/2013 | Teo et al. | |
| 2014/0266324 A1* | 9/2014 | Teo | H10D 62/8503 |
| | | | 327/109 |

OTHER PUBLICATIONS

Li, Zhongda, and T. Paul Chow. "Design and simulation of 5-20-kV GaN enhancement-mode vertical superjunction HEMT." IEEE transactions on electron devices 60.10 (2013): 3230-3237. (Year: 2013).*

* cited by examiner

521

501

531

521

501

531

507

NITRIDE SEMICONDUCTOR DEVICE

TECHNICAL FIELD

The present invention relates to a semiconductor device, and in particular, to nitride semiconductor device.

BACKGROUND

Group III Nitride semiconductors are important semiconductor materials, and mainly includes AlN, GaN, and InN, as well as compounds of these materials, such as AlGaN, InGaN, and AlInGaN. Due to advantages such as direct band gap, wide forbidden band and high breakdown electric field intensity, group III nitride semiconductors represented by GaN have broad application prospects in the fields such as light-emitting devices, power electronics and radio frequency devices.

Unlike conventional non-polar semiconductor materials such as Si, the group III nitride semiconductors have polarity. In other words, they are polar semiconductor materials. Polar semiconductors have many unique properties. Particularly importantly, fixed polarized charges are present at a surface of the polar semiconductor or at an interface of two different polar semiconductors. These fixed polarized charges may attract movable electron or hole carriers and thus form two-dimensional electron gas (2DEG) or two-dimensional hole gas (2DHG). The generation of 2DEG or 2DHG neither requires an additional electric field, nor depends on a doping effect in the semiconductor. It is spontaneously generated. The 2DEG or 2DHG at the interface of the polar semiconductors may have a high surface charge density. Meanwhile, without doping, the 2DEG or the 2DHG has high mobility because of reduction of ion scattering effect and so on that the 2DEG or the 2DHG is usually subjected to undertake. The high density of the surface charge and high mobility enable the 2DEG or 2DHG spontaneously generated at those interfaces to have good conductivity and high response speed.

In combination with inherent advantages of the nitride semiconductors such as high breakdown electric field, the 2DEG or 2DHG may be used to manufacture high mobility transistors. The performance in high energy, high voltage or high frequency applications is significantly better than the conventional Si or GaAs devices. However, existing structures have many defects, which seriously restrict the application ranges.

SUMMARY

With regard to the technical problems in the prior art, the present invention provides a semiconductor device, including:

BRIEF DESCRIPTION OF THE DRAWINGS

The preferred embodiments of the present invention will be further described below with reference to the accompanying drawings.

DETAILED DESCRIPTION

Figure 1A:
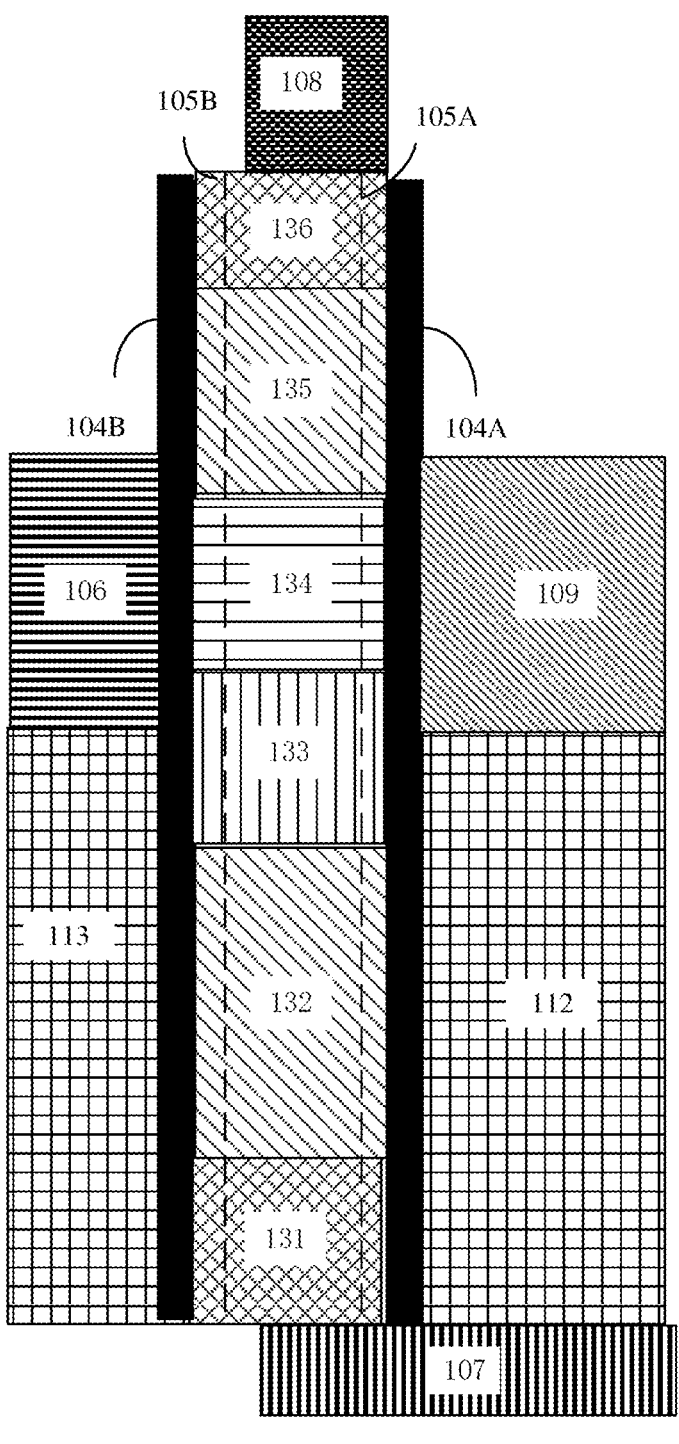
FIG. 1A is a sectional view of a single-channel HEMT according to an embodiment of the present invention.

To make the objectives, technical solutions, and advantages of the present invention clearer, the following clearly and completely describes the technical solutions in the embodiments of the present invention with reference to the accompanying drawings in the embodiments of the present invention. Apparently, the described embodiments are merely some rather than all of the embodiments of the present invention. All other embodiments obtained by persons of ordinary skill in the art based on the embodiments of the present invention without creative efforts fall within the scope of protection of the present invention.

In the following detailed description, reference may be made to various drawings which constitute a part of the present application and serve to explain specific embodiments of the present application. In the drawings, similar reference signs denote substantially similar components in different figures. The individual specific embodiments of the present application will be described in sufficient detail below to enable persons of ordinary knowledge and skills in the art to carry out the technical solutions of the present application. It is understood that other embodiments may be utilized, or structural, logical or electrical changes may be made to the embodiments of the present application.

The present invention provides a semiconductor device. In some embodiments, the semiconductor device may be formed on a foreign substrate. For example, by using a nucleation layer as a medium, usage of an expensive native substrate is avoided, a distance between a vertical heterojunction and a foreign substrate is increased, and thus the voltage withstanding of the semiconductor device is improved. Furthermore, in some embodiments, the foreign substrate can be removed, and thus the performance of the semiconductor device is further improved. The foreign substrate is a substrate other than a GaN intrinsic semiconductor, and includes, but is not limited to, a silicon Si substrate, a sapphire ($Al_2O_3$), and a silicon carbide SiC substrate, In the present application, involved carriers are electrons or holes. An involved doping type is an N type or a P type, and conductive majority carriers are also electrons or holes. Therefore, describing a situation that the carriers and the doped majority carriers are the same or opposite as the carrier type and the doping type being the same or opposite could be understood by a person skilled in the art. In addition, the description about electric contact in the present application not only includes a direct or indirect electrical connection relationship, but includes an electrical interaction relationship.

In the present application, P-type doping is usually doping a nitride semiconductor with elements such as Mg and Zn, and N-type doping is usually doping a nitride semiconductor with elements such as Si, O, Se and Ge.

The semiconductor device provided by the present invention may be a Schottky diode, an HEMT, an HHMT, or other semiconductor devices. The following takes an HEMT as an example for description. A person skilled in the art should understand that a Schottky diode can also be implemented by using a similar mode.

FIG. 1A is a sectional view of a single-channel HEMT according to an embodiment of the present invention. As shown in FIG. 1A, an HEMT 100 includes: a first channel layer 103 and a first barrier layer 104A. A first heterojunction having a vertical interface is formed between the first channel layer 103 and the first barrier layer 104A, and a vertical 2DEG 105A is formed in the first heterojunction.

In some embodiments, the first channel layer 103 includes a first channel region 132, a first gate doped region 134, and a second channel region 135. The first channel region 132 is an N-type doping region based on a nitride semiconductor (e.g., GaN). The doping is usually low doping or non-(intentional) adulteration, and the doping concentration is lower than 1E17/cm³. Low doping or non-doping in the first channel region 132 can reduce a channel carrier mobility reduction phenomenon caused by overall doping of the device.

The first gate doped region 134 is located above the first channel region 132. The first gate doped region 134 is a P-type doping region based on a nitride semiconductor (e.g., GaN). A majority carrier type in the first gate doped region 134 is opposite to a device carrier type. Based on the doping concentration of the first gate doped region, the first gate doped region 134 can deplete two-dimensional carriers (i.e., 2DEG) in the HEMT 100, implementing a normally off state of the device under a non-operating state (no voltage applied). Generally, the doping concentration of the first gate doped region 134 is 1E18-1E20/cm³. In some embodiments, the HEMT 100 has different threshold voltages due to different doping concentrations of the first gate doped region 134. Therefore, the doping concentration of the first gate doped region 134 also has a function of modulating the threshold voltage of the device.

The second channel region 135 is disposed above the first gate doped region 134. The second channel region 135 is an N-type doping region based on a nitride semiconductor (e.g., GaN). Low doping or non-(intentional) doping in the second channel region 135 can reduce a channel carrier mobility reduction phenomenon caused by overall doping of the device.

The first channel region 132, the first gate doped region 134, and the second channel region 135 are all components of the first channel layer 103, and each region is formed on the basis of a same nitride semiconductor or a nitride semiconductor having a similar forbidden band gap. Therefore, the forbidden band gap of the first channel layer 103, as the entirety of the channel layer, is uniform. In some embodiments, the first channel layer 103 further includes other regions formed on the basis of the same nitride semiconductor or a nitride semiconductor having a similar forbidden band gap. Furthermore, because the regions have the same or similar forbidden band gaps, electrical characteristics of transition parts between the regions are relatively stable, and have no adverse effect on the overall device performance.

In some embodiments, the first channel layer 103 is defined by a trench. A trench is first formed before the first channel layer 103 is formed. The height, width and other measures of the trench are the same as or similar to the height, width and other measures of a desired first channel layer. However, the first channel layer 103 is epitaxially grown in the trench. The first channel layer 103 formed in this mode has a greater aspect ratio, and epitaxial growing conditions and the morphology of the channel layer are more easily controlled.

As shown in FIG. 1A, the first barrier layer 104A is disposed at the right side of the first channel layer 103. The first heterojunction having the vertical interface is formed between the first channel layer 103 and the first barrier layer 104A, and the vertical 2DEG 105A is formed in the first heterojunction. Here, carriers of the 2DEG 105A are electrons. Moreover, doping types of the first channel region 132 and the second channel region 135 are the N type, and can also provide electrons. Therefore, is can be considered that the doping types of the first channel region 132 and the second channel region 135 are the same as a two-dimensional carrier type. Similarly, a doping type of the first gate doped region 134 is opposite to the two-dimensional carrier type.

Under normal growth conditions, surfaces of a channel layer and a barrier layer grown on a Si (111) surface are <0001> surfaces. That is to say, a direction from the Si substrate to the channel layer and the barrier layer is a <0001> crystal orientation. Under this crystal orientation, 2DEG is obtained at an interface close to the channel layer and the barrier layer in the channel layer. If the crystal orientation is opposite, i.e., a <000-1> direction, 2DHG is obtained at the interface close to the channel layer and the barrier layer in the channel layer.

In some embodiments, the first channel layer 103 and the first barrier layer 104A may be formed above the substrate and the nucleation layer (not shown). After this, the substrate and the nucleation layer are removed. In this way, a structure of a final device does not include the substrate and the nucleation layer, facilitating elimination of effects brought by a foreign substrate (for example, Si).

As shown in FIG. 1A, in the present embodiment, the HEMT 100 further includes: a first electrode 107 and a second electrode 108. The first electrode 107 is located below the first gate doped region 134 and in electric contact with the 2DEG 105A in the first heterojunction. The second electrode 108 is located above the first gate doped region 134 and also in electric contact with the 2DEG 105A in the first heterojunction. The first electrode 107 and the second electrode 108 may become a drain and a source of the HEMT 100. In the present embodiment, the first electrode 107 and the second electrode 108 are in ohmic contact with the channel layer and/or barrier layer 104A. As understood by a person skilled in the art, the electric contact here not only includes a direct or indirect electrical connection relationship, but includes an electrical interaction relationship.

As shown in FIG. 1A, the HEMT 100 further includes a third electrode 109. The third electrode 109 is in electric contact, in the first gate doped region 134, with the 2DEG 105A in the first heterojunction. The third electrode 109 is provided between the first electrode 107 and the second electrode 108, and can serve as a gate, controlling current intensity between the first electrode 107 and the second electrode 108, to form a HEMT structure. For example, a voltage applied to the third electrode 109 can be modulated as majority carriers (holes) in the first gate doped region 134. Under this effect, the carriers (electrons) in the 2DEG 105A are not in a depletion state, and a conductive channel is formed between the first electrode 107 and the second electrode 108 again. In some embodiments, a horizontal extending length of the third electrode 109 is not less than a length of the 2DEG 105A, to implement control on a current path between the first electrode 107 and the second electrode 108. Preferably, when the first electrode 107 serves as the drain to be connected to a high voltage, the third electrode 109 is located between the first electrode 107 and the second electrode 108, and is closer to the second electrode 108 which serves as the source. This configuration increases a distance between the drain and the gate, and can effectively improves the voltage withstanding of the semi-conductor device 100.

In some embodiments, the first channel layer 103 further includes a first electric field modulation doped region 133. The first electric field modulation doped region 133 is located near the third electrode, and electrically connected to the first gate doped region 134. As shown in FIG. 1A, the first electric field modulation doped region 133 is disposed between the first gate doped region 134 and the first elec-trode 107, and is closer to the first gate doped region 134. The first electric field modulation doped region 133 is also a P-type doping region based on a nitride semiconductor (e.g., GaN). The doping concentration is less than that of the first gate doped region 134, and is generally less than $2E19/cm^3$.

Therefore, the first gate doped region 134 needs to deplete all electrons in the 2DEG 105A, and therefore, the doping concentration thereof is relatively high. When the first electrode 107 (drain) is connected to a high voltage, local electric field intensity at a contact position between the first gate doped region 134 and the channel region 132 is not uniform, which affects the voltage withstanding of the device. The first electric field modulation doped region 133 therebetween, as a buffer, can avoid the problem above. Although the first electric field modulation doped region 133 is also P-type doped, compared with the first gate doped region 134, the doping concentration is lower, such that the electric field modulation doped region 134 is prevented from severely depleting the channel carrier concentration, which increases the on-resistance of the device. Hence, the electric field modulation doped region 133 adjusts electric field distribution of the device, reduces the local electric field intensity near the gate doped region 134, and avoids a breakdown phenomenon caused by an excessively high local electric field. Moreover, processing is also facilitated in process by first forming the first electric field modulation doped region 133 and then forming the first gate doped region 134 on the channel region 132.

In some embodiments, the first channel layer 103 further includes a first ohmic contact doped region 131. The first ohmic contact doped region 131 is located between the first channel region 132 and the first electrode 107. The first ohmic contact doped region 131 is configured to form ohmic contact with the first electrode 107. A doping type of the first ohmic contact doped region 131 is N-type, and the doping concentration of the first ohmic contact doped region 131 is $1E16$-$2E19/cm^3$. The first ohmic contact doped region 131 increases the concentration of carriers, and can reduce ohmic contact resistance with the first electrode 107.

In some embodiments, the first channel layer 103 further includes a second ohmic contact doped region 136. The second ohmic contact doped region 136 is located between the second channel region 135 and the second electrode 108. The second ohmic contact doped region 136 is configured to form ohmic contact with the second electrode 108. A doping type of the second ohmic contact doped region 136 is N-type, and the doping concentration of the second ohmic contact doped region 136 is $1E16$-$2E19/cm^3$. The second ohmic contact doped region 136 increases the concentration of carriers, and can reduce ohmic contact resistance with the second electrode 108.

In some embodiments, the HEMT 100 further includes a second barrier layer 104B, which is formed at the left side of the first channel layer 103, where a second heterojunction having a vertical interface is formed between the first channel layer 103 and the second barrier layer 104B, and a vertical 2DHG 105B is formed in the second heterojunction. The second barrier layer 104B may be made of a same nitride semiconductor material as the first barrier layer 104A.

The 2DEG 105A and the 2DHG 105B form complemen-tary channels. For example, when the HEMT 100 is in an off state, the 2DEG 105A is close to the first electrode 107 and at high potential, the 2DEG of the first gate doped region 134 and the first electrode 107 is depleted, and a background positive charge is exposed. An electric field having a certain direction is formed inside the HEMT 100, such that the electric field distribution inside the HEMT 100 is not uni-form, and thus the device performance is affected. The 2DHG 105B is not connected to other electrodes, and the non-uniform electric field distribution inside the HEMT 100 causes the distribution of the 2DHG to change, making the electric field distribution inside the HEMT 100 more uni-form, such that the device works more stably. A person skilled in the art should understand that the 2DHG 105B can be formed at one side of all or some regions of the first channel layer 103, such that the regions all have a function of regulating an internal electric field. In particular, the 2DHG may form a region of the first channel layer 103 corresponding to a position between the first electrode (drain) and the third electrode (gate) (e.g., the first ohmic contact doped region 131, the first channel region 132, the electric field modulation doped region 133, and the first gate doped region 134), so as to improve the voltage withstand-ing of the device.

In some embodiments, also included is a fourth electrode 106, which is disposed at a position near the first gate doped region 134, and electrically connected to the first gate doped region 134. When there is no second heterojunction and 2DHG 105B, the fourth electrode 106 is directly or indi-rectly in electric contact with the first gate doped region 134. Or, as shown in FIG. 1A, the fourth electrode 106 is located at the position of the first gate doped region 134 and in electric contact with the 2DHG 105B in the second hetero-junction. The fourth electrode 106 may be controlled inde-pendently as a body electrode, or may be electrically con-nected to the second electrode 108. As exemplified, the fourth electrode 106 may optionally be connected to a 0 V voltage.

When the HEMT 100 works, the electrode 109 is con-nected to an external voltage to start the device. When the electrode 109 is connected to the external voltage, charges introduced by connecting to an external voltage cannot be fully released, and partial residual charges may be formed in the first gate doped region 134. These residual charges neutralize the majority carriers in the first gate doped region 134 to a certain extent. Therefore, when the HEMT 100 works again, the threshold voltage of the HEMT 100 may drift. After the fourth electrode 106 is added, when the HEMT 100 is turned off, the residual charges are conducted outside the device by means of the fourth electrode (body electrode). Therefore, the potential of the first gate doped region 134 is relatively fixed, and the threshold voltage of the HEMT 100 is also more stable.

Figure 1B:
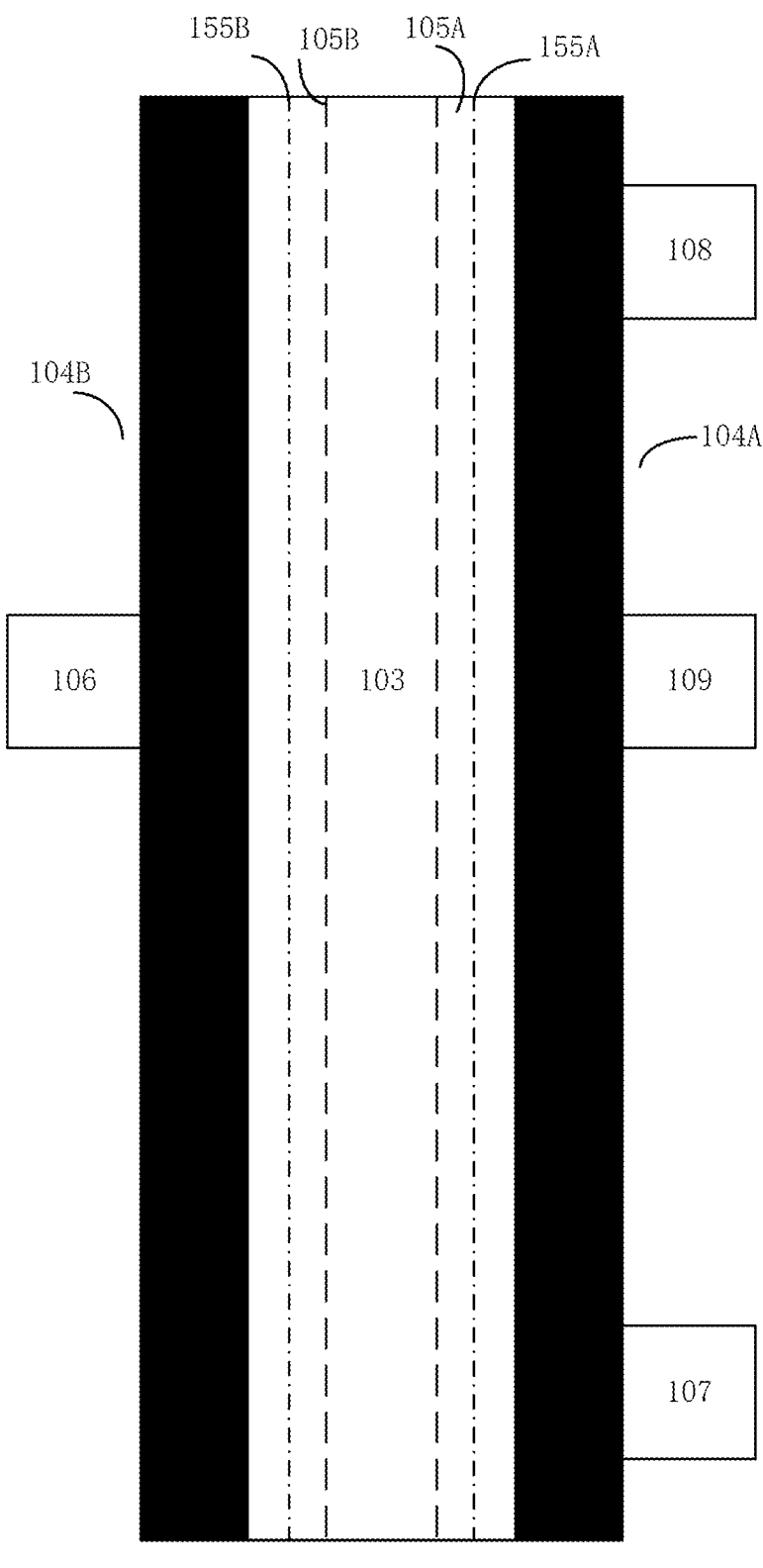
FIG. 1B is a schematic structural diagram of an electric field of a device having a body electrode and complementary channels in an on state according to an embodiment of the present invention.
Figure 1C:
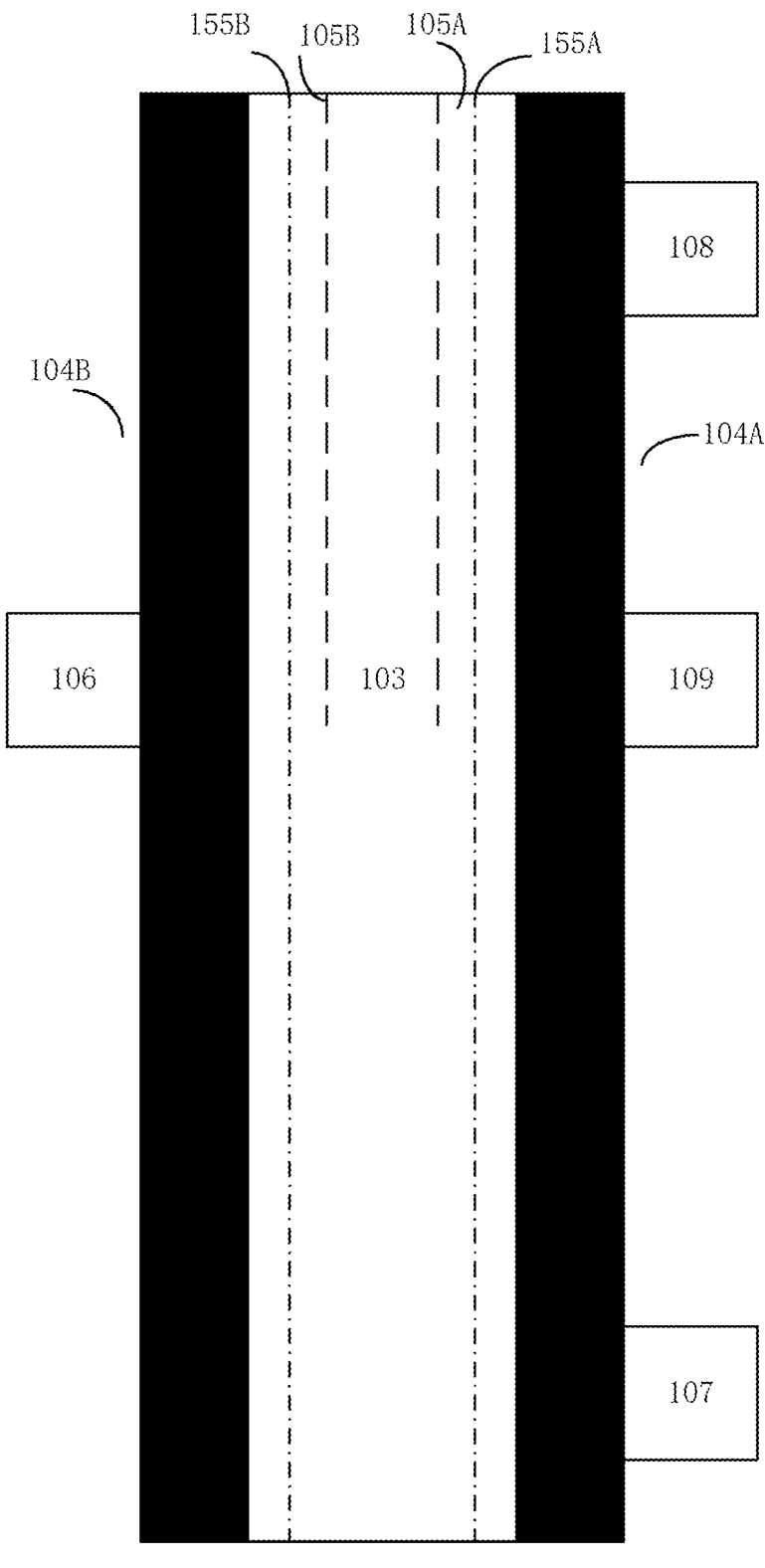
FIG. 1C is a schematic structural diagram of an electric field of a device having a body electrode and complementary channels when the complementary channels are in an off state according to an embodiment of the present invention.

A balance adjusting function of the complementary chan-nels and the fourth electrode on the electric field inside the device is described in detail below in combination with FIG. 1B and FIG. 1C. In order to facilitate simplifying the device structure, a person skilled in the art should know that the technical effect is applicable to a device having the structure. FIG. 1B is a schematic structural diagram of an electric field of a device having a body electrode and complementary channels in an on state according to an embodiment of the present invention. FIG. 1C is a schematic structural diagram of an electric field of a device having a body electrode and complementary channels when the complementary channels are in an off state according to an embodiment of the present invention. A structure same as or similar to that in FIG. 1A is not repeated here.

FIG. 1B further includes a background positive charge 155A corresponding to the 2DEG 105A and a background negative charge 155B corresponding to the 2DHG 105B. As shown in FIG. 1B, when the device is turned on, the electric field inside the device is uniformly distributed, and the fourth electrode 106 basically has no effect. In the structure involved in the present application, the electric field distribution when the device is in an off state is as shown in FIG. 1C. When the 2DHG 105B and the fourth electrode 106 (body electrode) exist simultaneously, the fourth electrode 106 is located at the left side of the 2DHG 105B, and electrically connected to the 2DHG 105B. When the device is in the off state, the 2DHG 105B makes contact by means of the fourth electrode 106. Because the voltage of the fourth electrode 106 is far lower than the voltage of the first electrode 107, the 2DHG 105B is fully or partially depleted, and the background negative charge is exposed. The background negative charge on the left side and the background positive charge on the right side form a stable internal electric field, which is distributed more uniformly, such that the device works more stably.

In some embodiments, the HEMT 100 further includes a first nucleation layer. The first channel layer 103 is epitaxially grown from the first nucleation layer. In some embodiments, the first channel layer 103 is located above the first nucleation layer. In some embodiments, the first nucleation layer is doped, and therefore has good conductivity. In some embodiments, the first nucleation layer is epitaxially grown from the first vertical interface of the substrate.

In some embodiments, an insulating layer 112 is included between the electrode 107 and the electrode 109 at the side surfaces of the barrier layer 104A. The insulating layer 112 extends horizontally, and a material thereof may be an insulating material such as $SiO_2$. In some embodiments, the shielding layer 112 may be a gate insulating layer, and is partially filled between the barrier layer 104A and the electrode 109.

In some embodiments, the insulating layer 113 is included below the electrode 106 at the side surface of the barrier layer 104B. The insulating layer 113 extends horizontally, and a material thereof may be an insulating material such as $SiO_2$. The shielding layer 112 and the insulating layer 113 isolate the side surfaces of the barrier layer 104A and the barrier layer 104B from the outside, capable of preventing the outside from affecting the device performance.

In some embodiments, a passivation layer (not shown) may be included above the semiconductor device shown in FIG. 1A for protecting the semiconductor structure below. Furthermore, a first conductor interconnecting layer, a second conductor interconnecting layer and a third conductor interconnecting layer are further included above the semiconductor device, and are electrically connected to the first electrode 107, the second electrode 108 and the third electrode 109, respectively. These are all well known by a person skilled in the art and is not repeated here. In some embodiments, the fourth electrode is electrically connected, on the outside, to a fourth conductor interconnecting layer above the semiconductor device. The fourth electrodes respectively correspond to respective conductor interconnecting layers, and have different connection positions in the vertical direction. The process is simpler.

In some embodiments, the HEMT 100 further includes a foreign substrate. In the present embodiment, the substrate is a silicon Si substrate. The lattice of the vertical surface of the substrate has hexagonal symmetry, such that a nitride semiconductor crystal can then be epitaxially grown. For example, an exposed vertical interface of the substrate may be a Si (111) surface. In some other embodiments, the substrate may also be a sapphire $Al_2O_3$ substrate, a SiC substrate, or a GaN intrinsic substrate. In some embodiments, the nucleation layer may be AlN. Here, the nucleation layer may also include a buffer layer (not shown). The buffer layer may have a single-layer or multilayer structure, and includes one or more of AlN, GaN, AlGaN, InGaN, AlInN and AlGaInN.

As known by a person skilled in the art, the foregoing description merely exemplarily describes the HEMT structure. There are many other structures or improvements, changes, or modifications on those structures for the devices involved in the present application to provide different properties or functions. Those structures and improvements, changes, or modifications on them are within the scope of technical concept of the present invention and may be also applied in the technical solutions of the present invention.

The semiconductor device involved in the present invention, compared with a conventional device, includes 2DEG having the vertical structure, and the components of the channel layer of the semiconductor device are not made of a single material, but are formed by means of different doping in a plurality of regions. The doping type of the gate doped region is opposite to the carrier type, and the carriers can be depleted, such that the device can implement a normally off state under a normal condition that no voltage is applied to the gate. A conventional device does not have a similar structure, and therefore is in a normally on state. Power consumption is greatly increased in practical application.

The semiconductor device involved in the present invention does not includes structures such as a substrate and a nucleation layer. However, the formation process is carried out on a foreign substrate, e.g., Si. The process cost is relatively low. After the device is formed, the substrate and the nucleation layer are removed, avoiding defects such as low voltage withstanding of the foreign substrate. Compared with conventional devices, the formed device has better voltage withstanding and carrier mobility.

Figure 2:
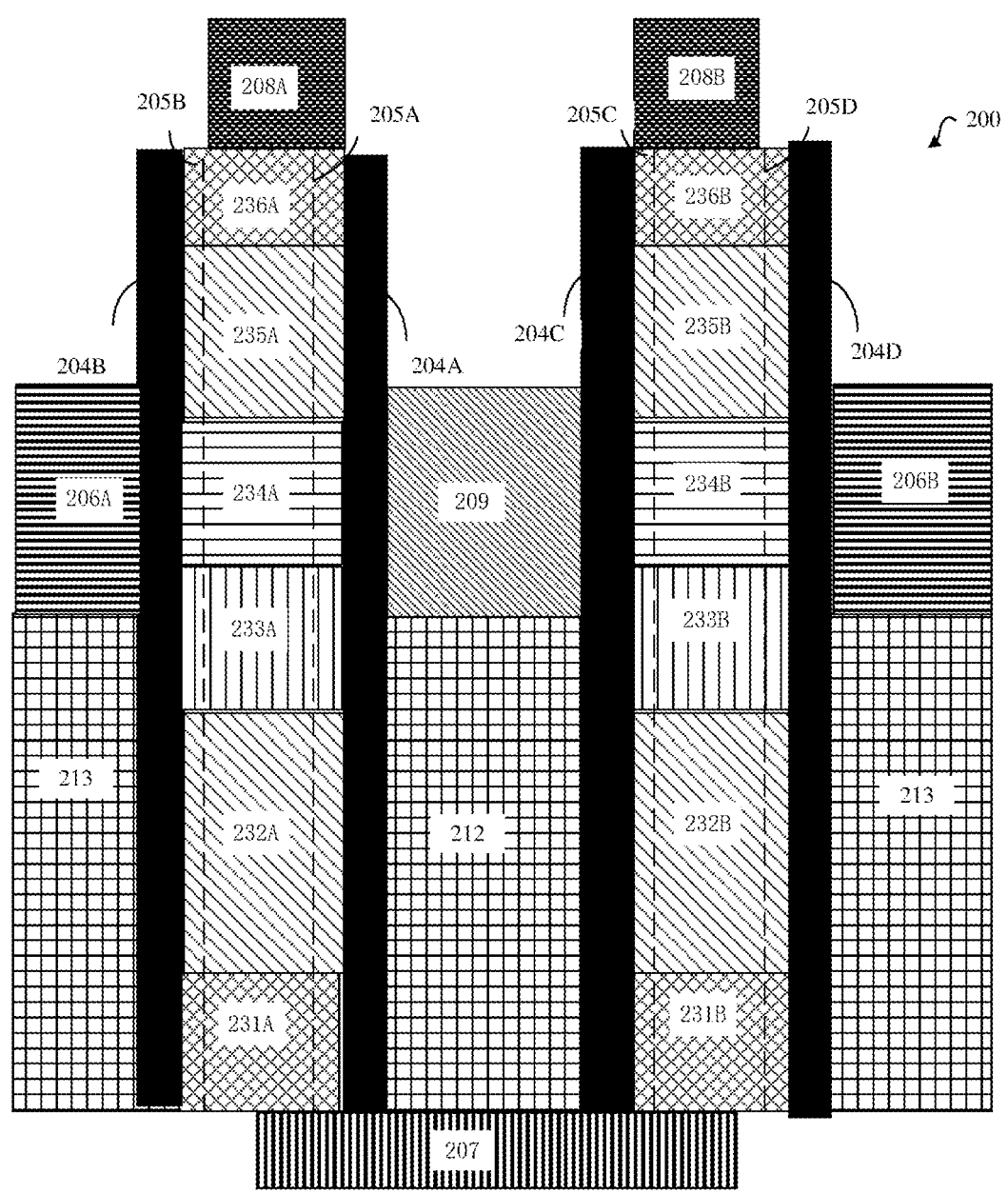
FIG. 2 is a sectional view of a dual-channel HEMT according to an embodiment of the present invention.

The present invention further includes a dual-channel HEMT structure. FIG. 2 is a sectional view of a dual-channel HEMT according to an embodiment of the present invention. The HEMT 200 shown in FIG. 2 may also be considered to be composed of two semiconductor devices HEMT 100 as shown in FIG. 1, where parts similar to the foregoing structure is not repeated here.

As shown in FIG. 2, the HEMT 200 includes, on the left side, a first channel layer 203A, which includes a first ohmic contact doped region 231A, a first channel region 232A, a first electric field modulation doped region 233A, a first gate doped region 234A, a second channel region 235A and a second ohmic contact doped region 236A which are stacked from bottom to top. The HEMT 200 includes, on the right side, a second channel layer 203B, which includes a third ohmic contact doped region 231B, a third channel region 232B, a second electric field modulation doped region 233B, a second gate doped region 234B, a fourth channel region 235B and a fourth ohmic contact doped region 236B which are stacked from bottom to top.

The right side of the first channel layer 203A of the HEMT 200 further includes a first barrier layer 204A, and the left side of the second channel layer 203B further includes a third barrier layer 204C. Because the first channel layer 203A has different energy band gaps with the first and second barrier layers 204A and 204C, a first heterojunction and a third heterojunction both having a vertical interface are formed in the HEMT 200, and vertical 2DEG 205A and 2DEG 205C are formed in the two heterojunctions.

The ohmic contact doped region 236A and the ohmic contact doped region 236B are respectively provided with an electrode 208A and an electrode 208B, which are respectively in ohmic contact with the ohmic contact doped region 236A and the ohmic contact doped region 236B, and electrically connected to the 2DEG 205A and the 2DEG 205C. In the HEMT 200, the 2DEG 205A and the 2DEG 205C in the two channel layers are respectively formed to the right side and to the left side of the channel layers because in the formation process, substrate vertical interfaces for growing the structures of the two parts are arranged in a same crystal orientation structure and opposite to each other. This structure can achieve a higher integration level.

The left side of the first channel layer 203A of the HEMT 200 further includes a second barrier layer 204B, and the right side of the second channel layer 203B further includes a fourth barrier layer 204D. Because the channel layer has different energy band gaps with the barrier layers 204B and 204D, a second heterojunction and a fourth heterojunction both having a vertical interface are formed in the HEMT 200. Vertical 2DHG 205B and 2DHG 205D are formed in the two heterojunctions.

In some embodiments, a fourth electrode 206A is further disposed at a position on the left side of the second barrier layer 204B of the HEMT 200 and close to the gate doped region 234A, and the fourth electrode 206A is in electric contact with the 2DHG 205B in the heterojunction in the first gate doped region 234A. A fourth electrode 206B is further disposed at a position on the right side of the second barrier layer 204D of the HEMT 200 and close to the gate doped region 234B, and the fourth electrode 206B is in electric contact with the 2DHG 205C in the heterojunction in the first gate doped region 234B. The fourth electrodes 206A and 206B may be controlled independently as body electrodes, or may be electrically connected to the second electrodes 208A and 208B. Optionally, the fourth electrodes 206A and 206B are connected to a 0 V voltage.

In the HEMT 200, for the first channel layer 203A and the second channel layer 203B, an electrode 209 is shared as a gate, and an electrode 207 is shared as a drain. In some embodiments, the first channel layer and the second channel layer have respective gates and drains.

In the present embodiment, the HEMT 200 not only has advantages of the HEMT 100, but the HEMT 200 also includes two conductive channels, i.e., 2DEG 205A and 2DEG 205C. The added conductive channel can increase an on-state current, and thus achieves higher power. Moreover, compared with the single conductive channel, the voltage withstanding and heat resistance of double conductive channels are also better. Moreover, electrodes having the same properties of a dual-conductive channel structure can be shared, and there is no need to form two electrodes, such that the space is saved, and manufacturing cost and manufacturing time are obviously saved.

Figure 3:
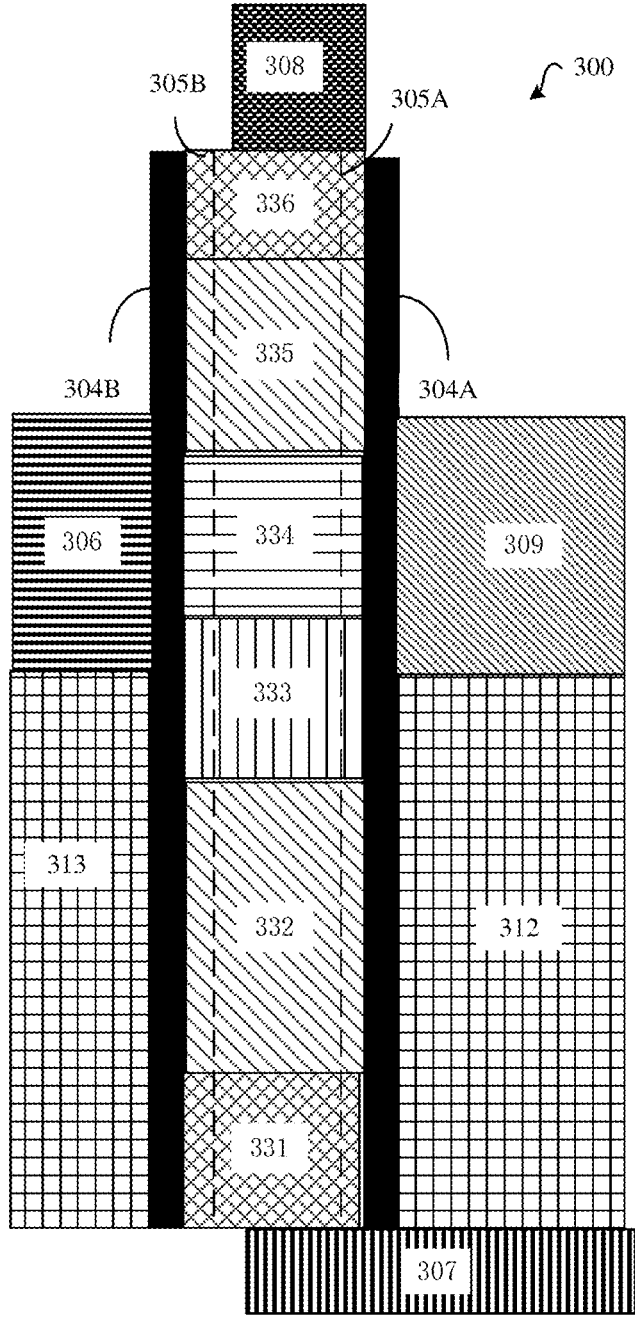
FIG. 3 is a sectional view of a single-channel HHMT according to an embodiment of the present invention.

In some embodiments, a high hole mobility transistor (HHMT) having 2DHG may also be formed by a similar structure. FIG. 3 is a sectional view of a single-channel HHMT according to an embodiment of the present invention. The part having a similar structure to that in FIG. 1 is not repeated here.

As shown in FIG. 3, the entire structure of a HHMT 300 is similar to that of the HEMT 100, but because a vertical interface of a substrate of a (000-1) surface in the formation process, which is different from that of the HEMT 100, a conductive channel in the HHMT 300 is 2DHG 305A. Accordingly, the HHMT 300 further includes 2DEG 305B. Because the conductive channel is 2DHG 105A, carriers thereof are also changed from electrons to holes. Therefore, doping types of an ohmic contact doped region 331, a channel region 332, a channel region 335, and an ohmic contact doped region 336 in the HHMT 300 are P type. Doping types of an electric field modulation doped region 333 and a gate doped region 334 are N type.

In the present embodiment, the HHMT does not have a substrate and a nucleation layer, which do not affect the conductive channel, and thus the performance of the device is further improved.

Figure 4:
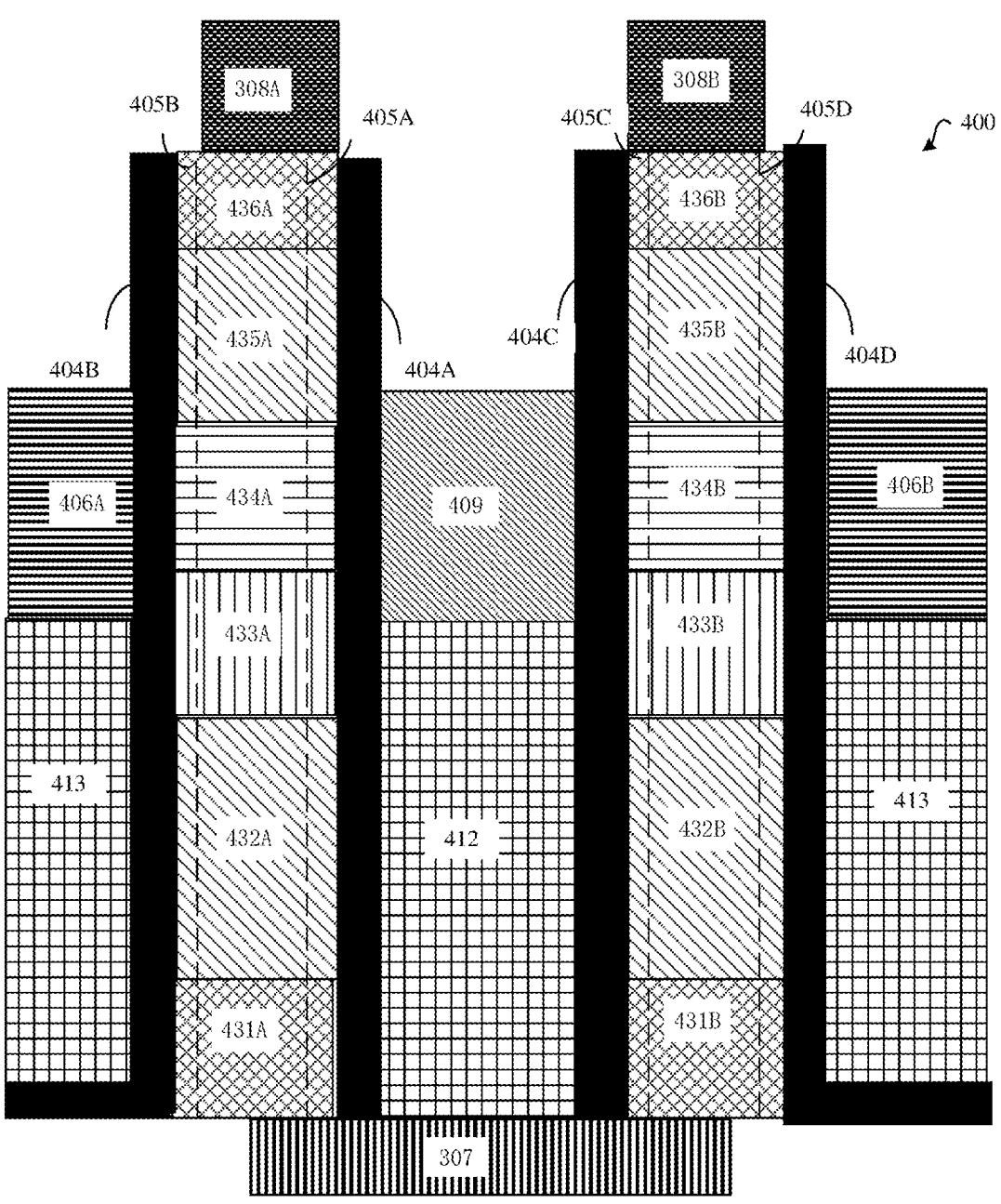
FIG. 4 is a sectional view of a dual-channel HHMT according to an embodiment of the present invention.

FIG. 4 is a sectional view of a dual-channel HHMT according to another embodiment of the present invention. A HHMT 400 shown in FIG. 4 may also be considered to be composed of two semiconductor devices HHMT 300 as shown in FIG. 3, where parts similar to the foregoing structure is not repeated here.

As shown in FIG. 4, the HHMT 400 includes, on the left side, a first channel layer 403A, which includes a first ohmic contact doped region 431A, a first channel region 432A, a first electric field modulation doped region 433A, a first gate doped region 434A, a second channel region 435A and a second ohmic contact doped region 436A which are stacked from bottom to top. The HHMT 400 includes, on the right side, a second channel layer, which includes a third ohmic contact doped region 431B, a third channel region 432B, a second electric field modulation doped region 433B, a second gate doped region 434B, a fourth channel region 435B and a fourth ohmic contact doped region 436B which are stacked from bottom to top.

The right side of the first channel layer 403A of the HHMT 400 further includes a first barrier layer 404A, and the left side of the second channel layer 403B further includes a third barrier layer 404C. Because the channel layer has different energy band gaps with the barrier layers 404A and 404C, a first heterojunction and a third heterojunction both having a vertical interface are formed in the HHMT 200. Vertical 2DHG 405A and 2DHG 405C are formed in the two heterojunctions.

The ohmic contact doped region 436A and the ohmic contact doped region 436B are respectively provided with an electrode 408A and an electrode 408B, which are respectively in ohmic contact with the ohmic contact doped region 436A and the ohmic contact doped region 436B, and electrically connected to the 2DHG 405A and the 2DHG 405C.

The left side of the first channel layer 403A of the HEMT 400 further includes a second barrier layer 404B, and the right side of the second channel layer 403B further includes a fourth barrier layer 404D. Because the channel layer has different energy band gaps with the barrier layers 404B and 404D, a second heterojunction and a fourth heterojunction both having a vertical interface are formed in the HEMT 400. Vertical 2DHG 405B and 2DHG 405D are formed in the two heterojunctions.

In some embodiments, an electrode 406A is further disposed at a position on the left side of the second barrier layer 404B of the HHMT 400 and close to the gate doped region 434A, and the electrode 406A is in electric contact with the 2DHG 405B in the heterojunction in the first gate doped region 434A. An electrode 406B is further disposed at a position on the right side of the second barrier layer 404D of the HHMT 400 and close to the gate doped region 434B, and the electrode 206B is in electric contact with the 2DHG 405C in the heterojunction in the first gate doped region 434B. The electrodes 406A and 406B may be controlled independently as body electrodes, or may be electrically connected to the electrodes 408A and 408B. Optionally, the electrodes 406A and 406B are connected to a 0 V voltage.

In the HEMT 400, for the first channel layer 403A and the second channel layer 403B, an electrode 409 is shared as a gate, and an electrode 407 is shared as a drain. In some embodiments, the first channel layer and the second channel layer have respective gates and drains.

In the present embodiment, the HEMT 400 includes two conductive channels, i.e., 2DHG 405A and 2DHG 405C. The added conductive channel can increase an on-state current, and thus achieves higher power. Moreover, compared with the single conductive channel, the voltage withstanding and heat resistance of double conductive channels are also better. Moreover, electrodes having the same properties of a dual-conductive channel structure can be shared, and there is no need to form two electrodes, such that the space is saved, and manufacturing cost and manufacturing time are obviously saved.

The present invention further includes a manufacturing method for a semiconductor device. A manufacturing method for a semiconductor device of the present invention is described below by taking a manufacturing process for a dual-channel HEMT as an example.

Figures 5A, 5B:
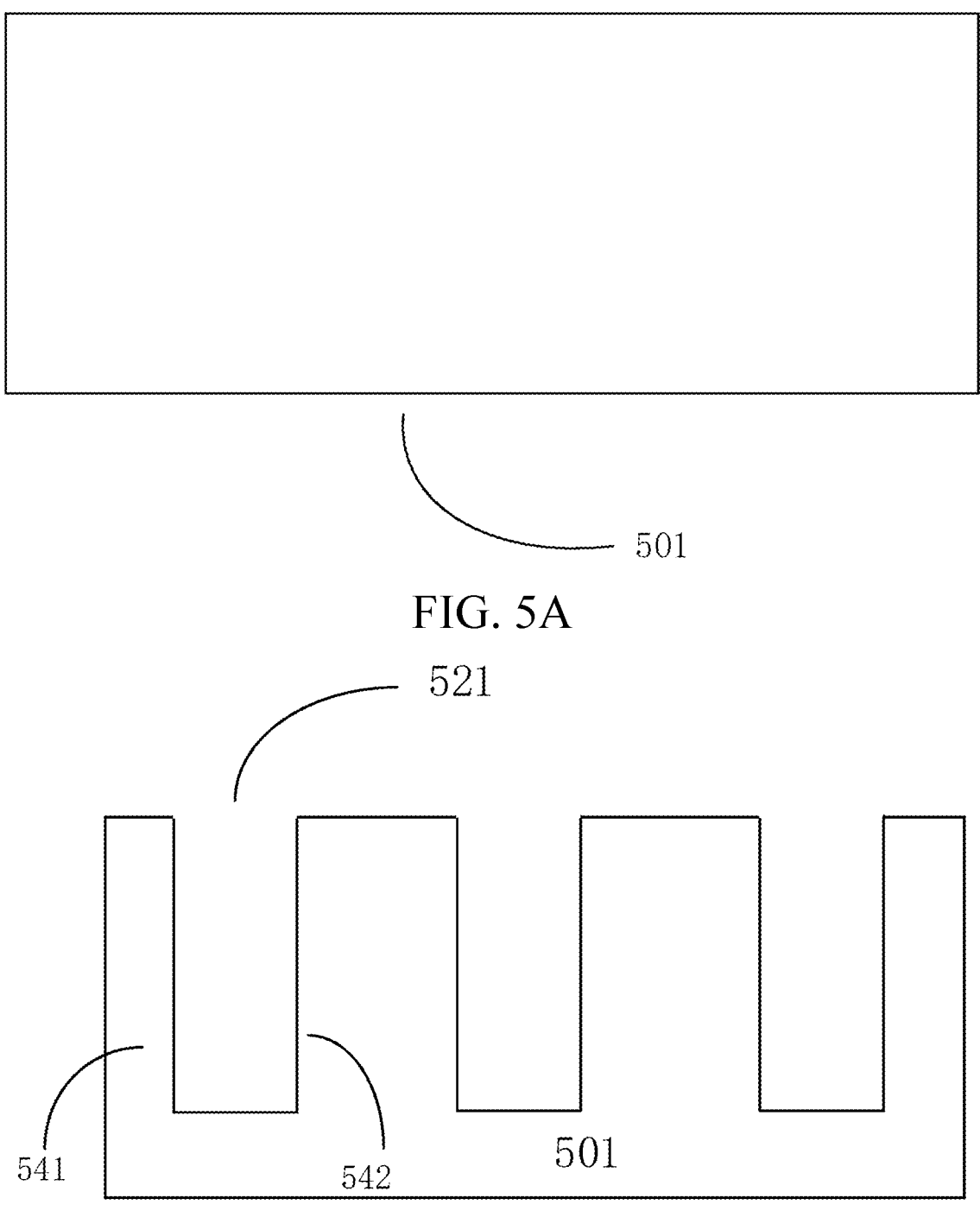
FIG. 5A to FIG. 5Z are schematic flowcharts of a manufacturing method for a dual-channel HEMT according to an embodiment of the present invention.
Figures 5C, 5D:
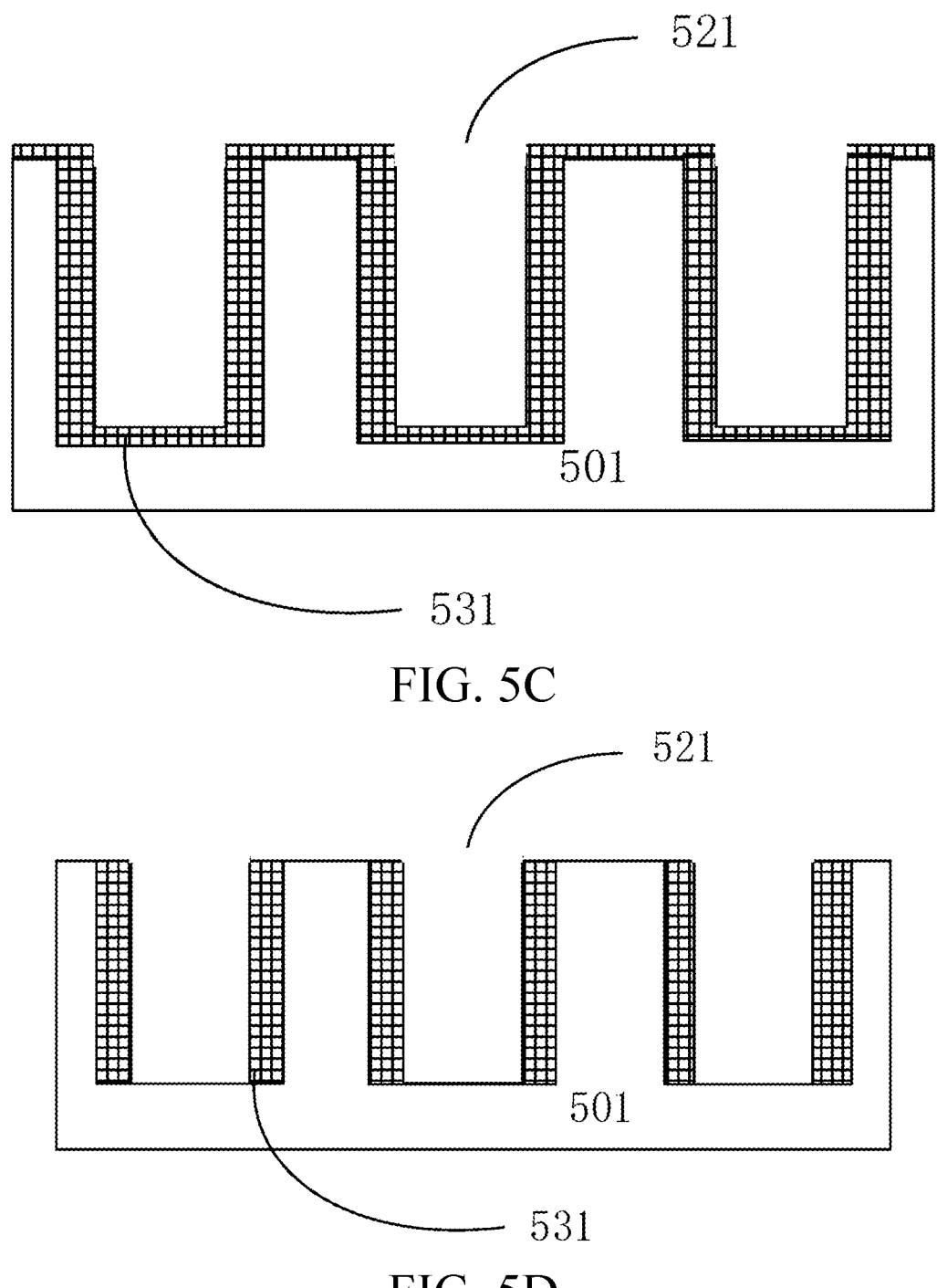
Figure 5E:
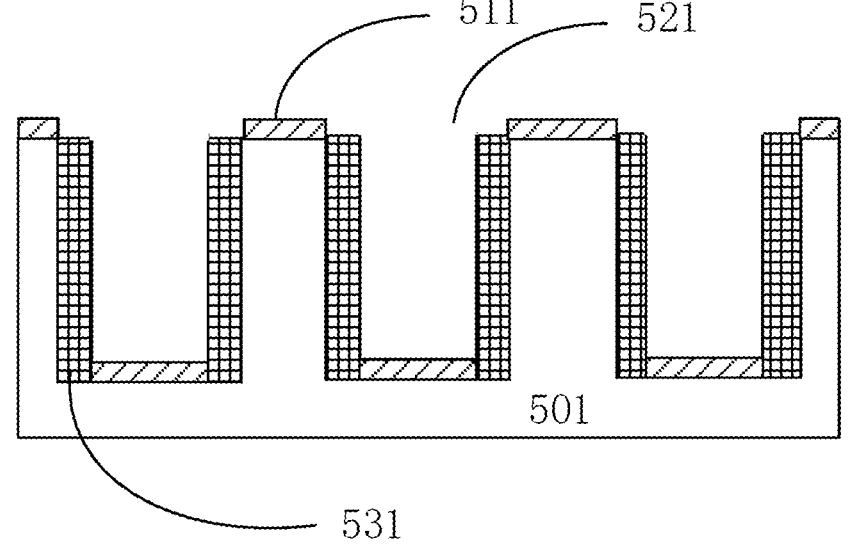
Figure 5F:
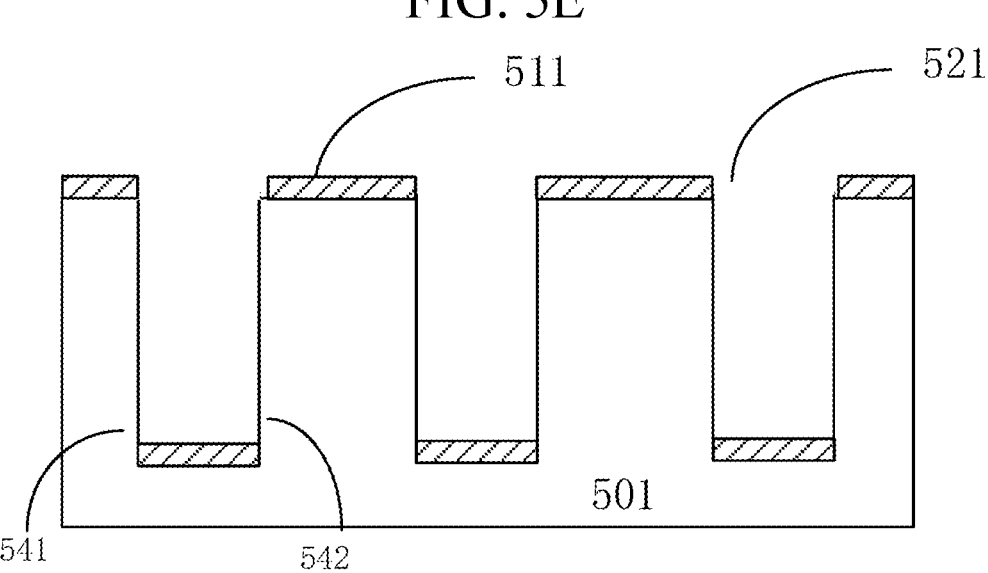
Figure 5G:
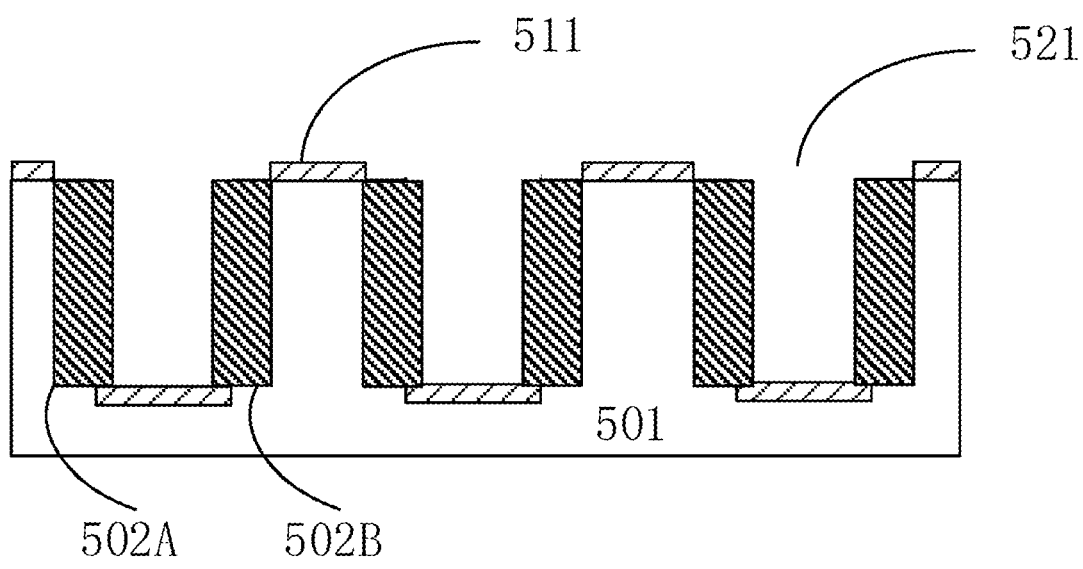
Figure 5H:
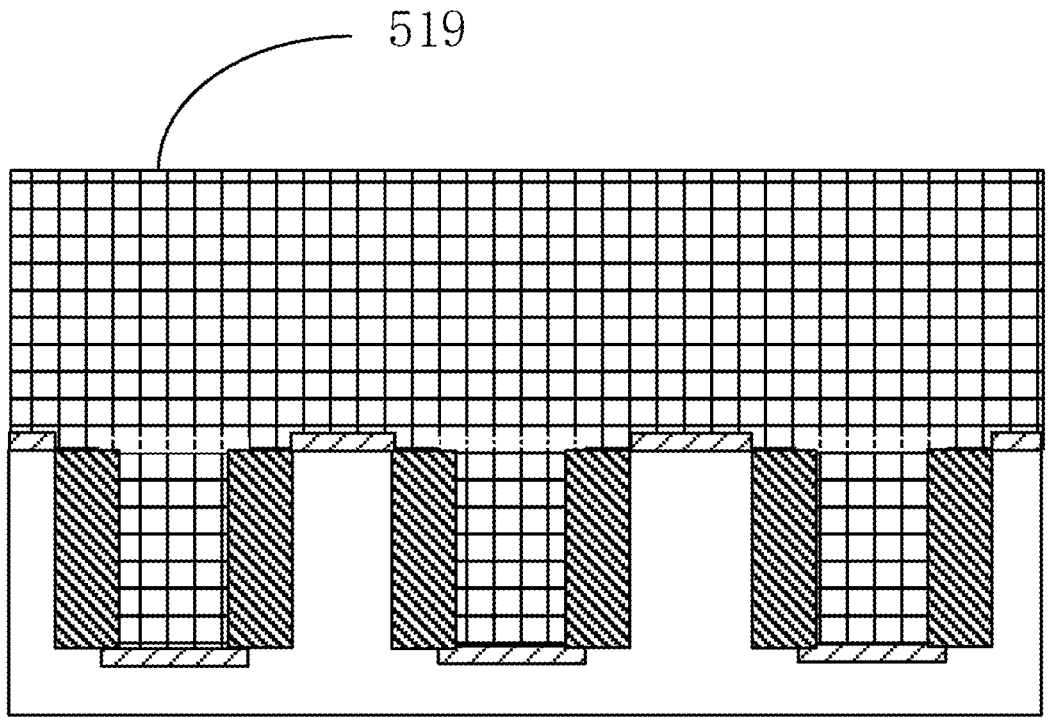
Figure 5I:
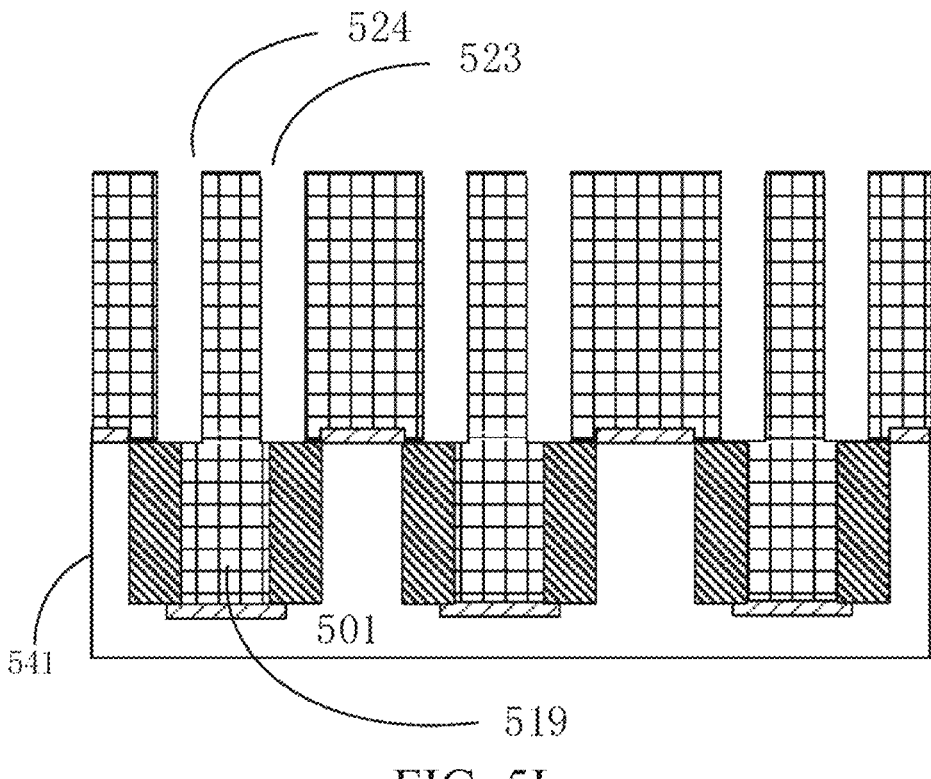
Figure 5J:
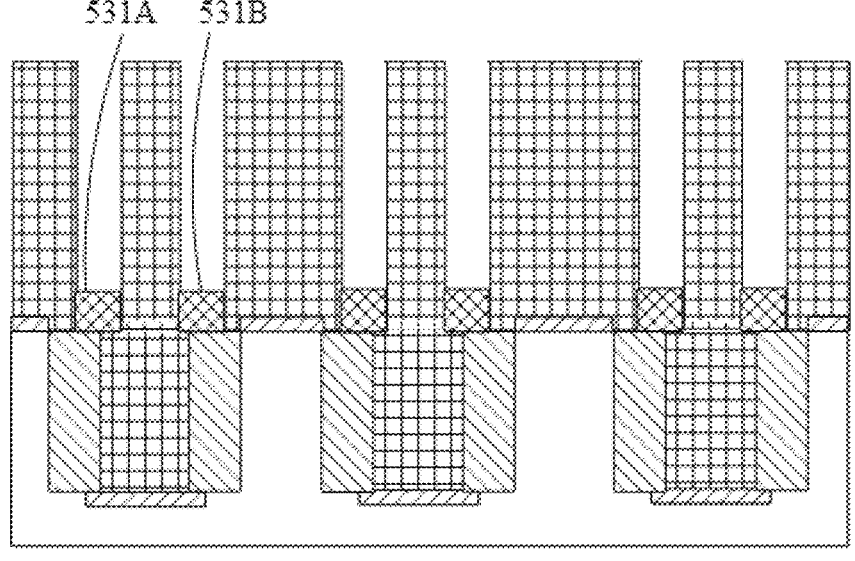
Figure 5K:
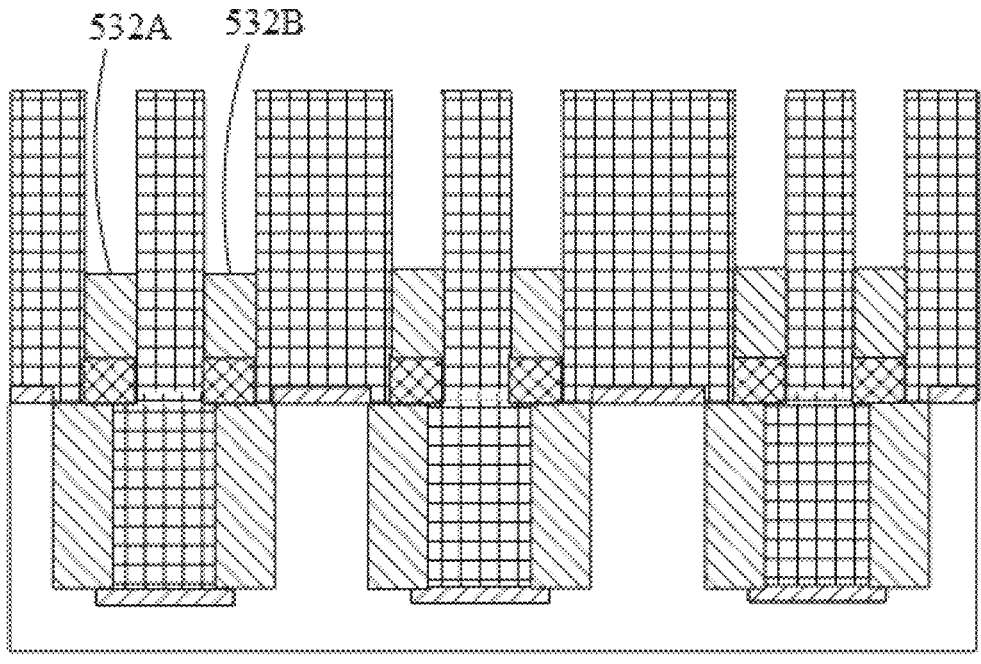
Figure 5L:
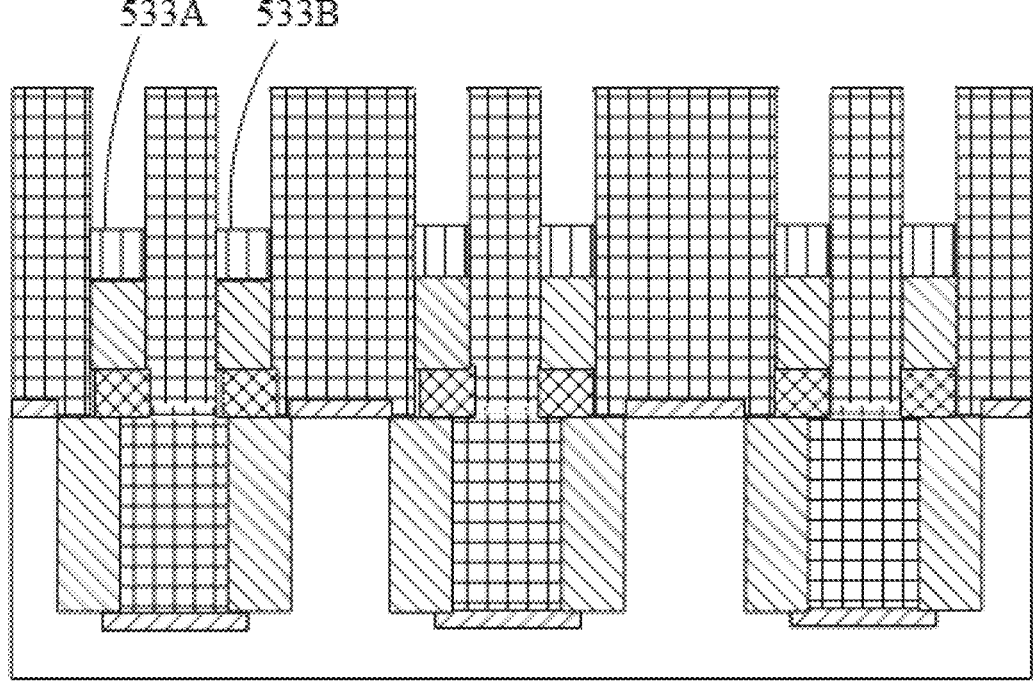
Figure 5M:
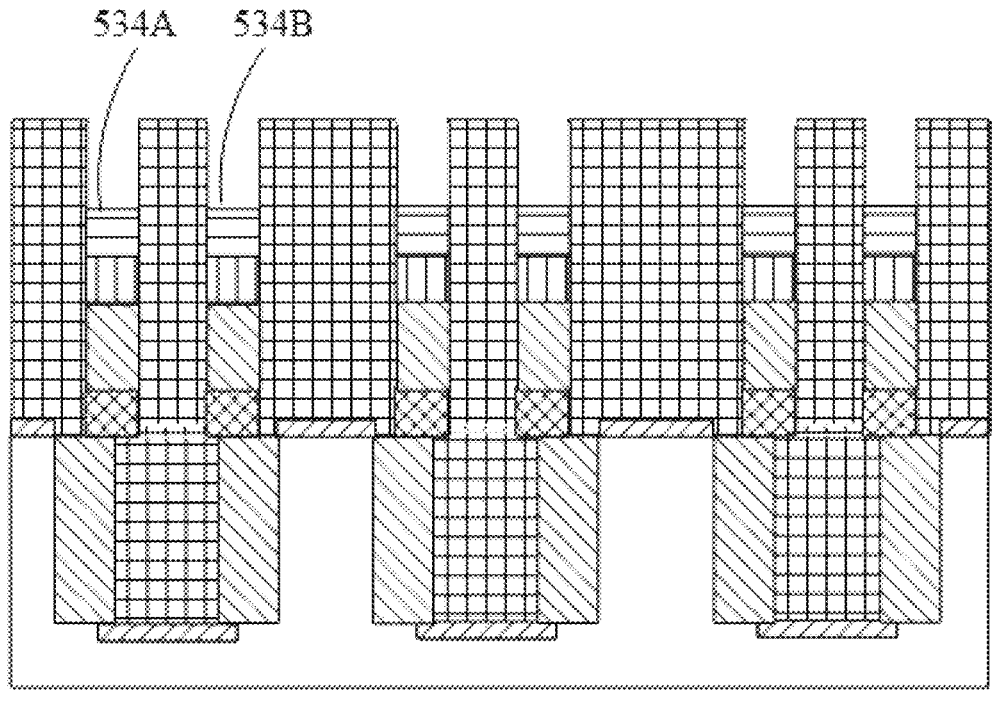
Figure 5N:
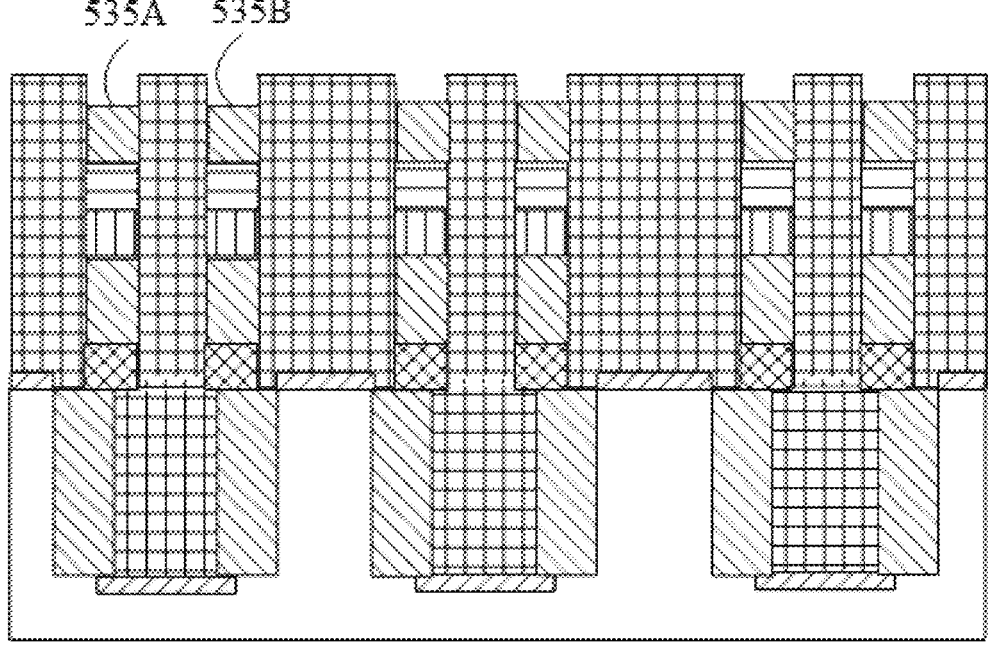
Figures 5O, 5P:
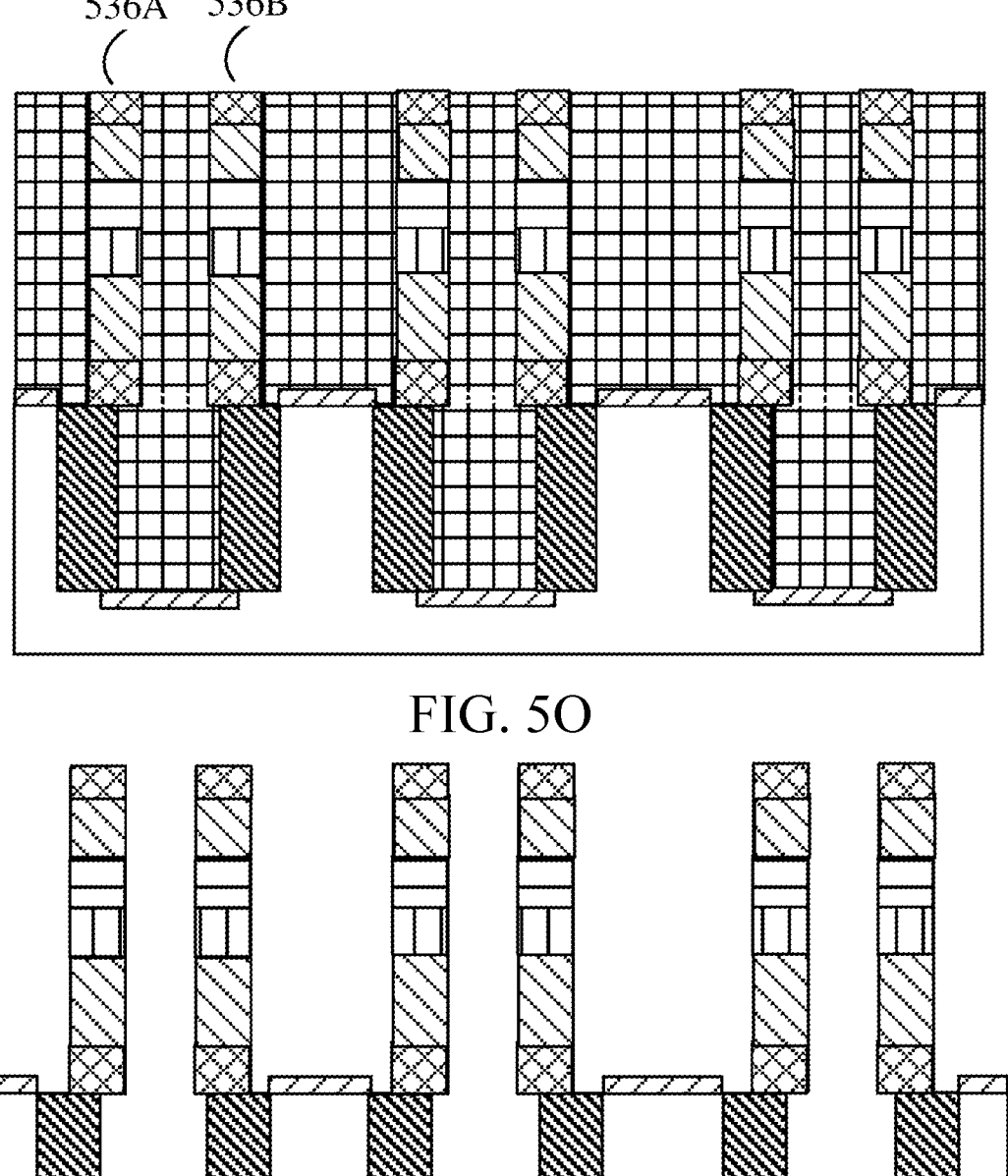
Figure 5Q:
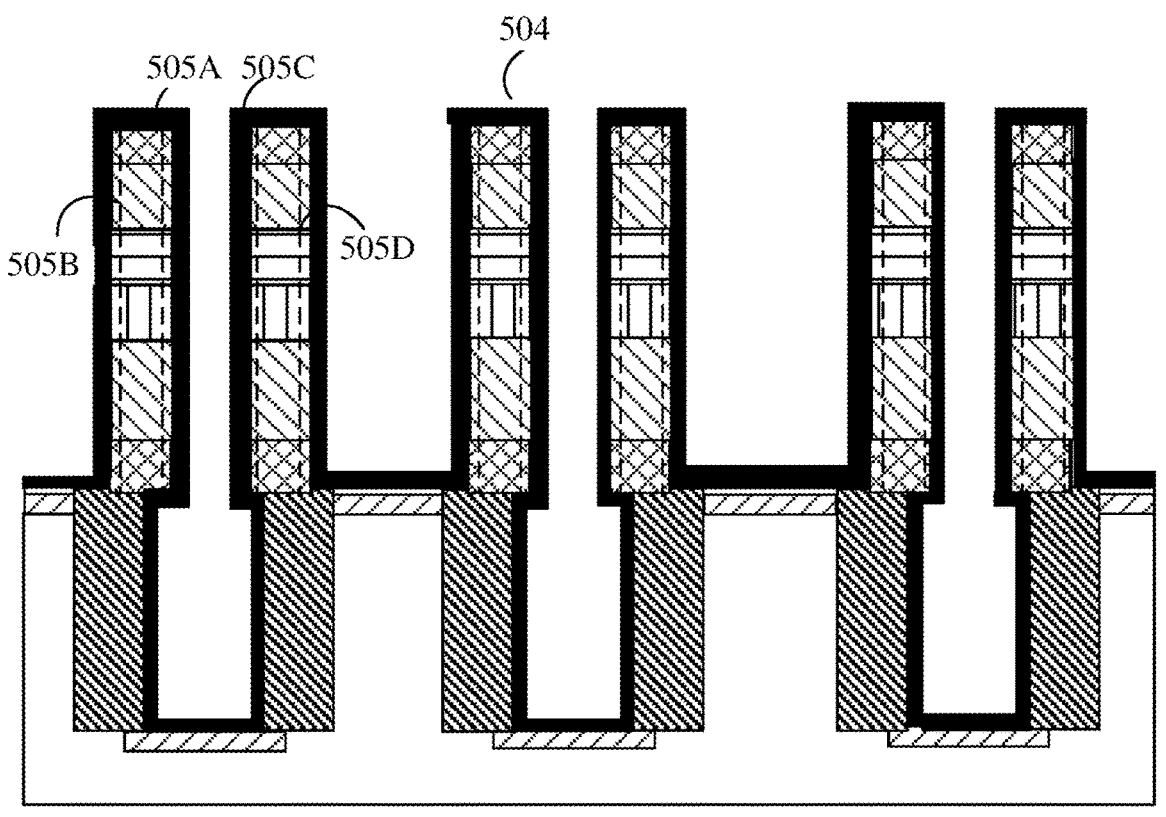
Figure 5R:
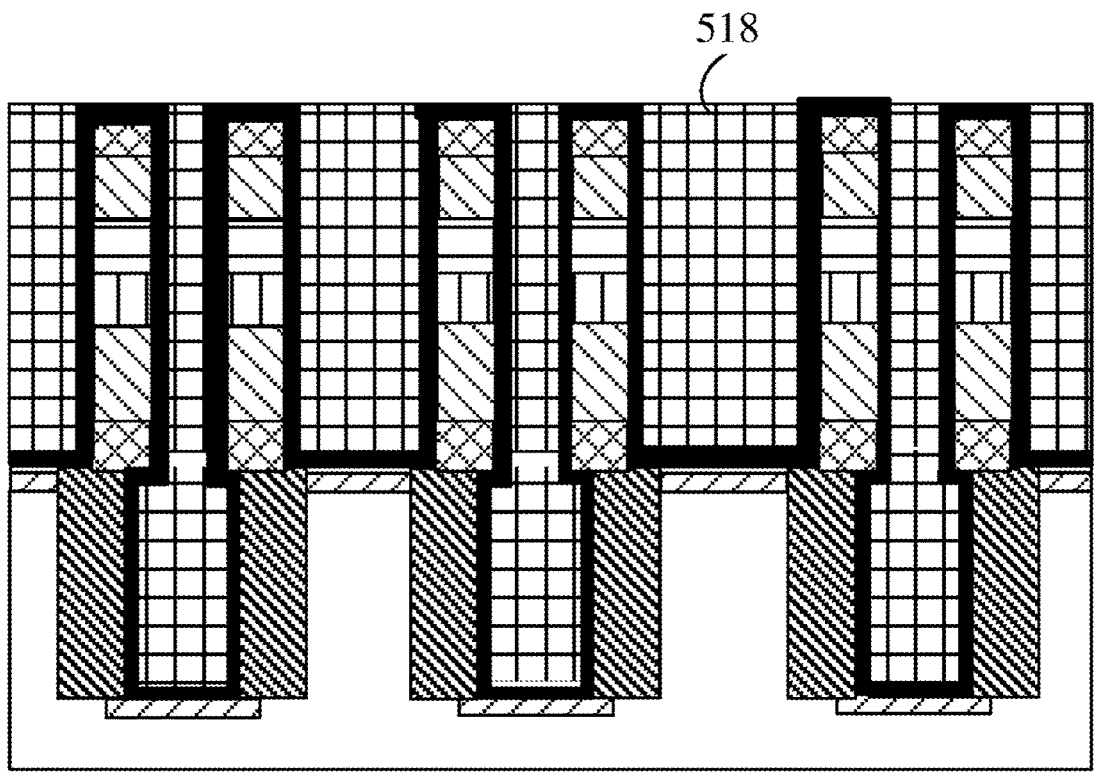
Figure 5S:
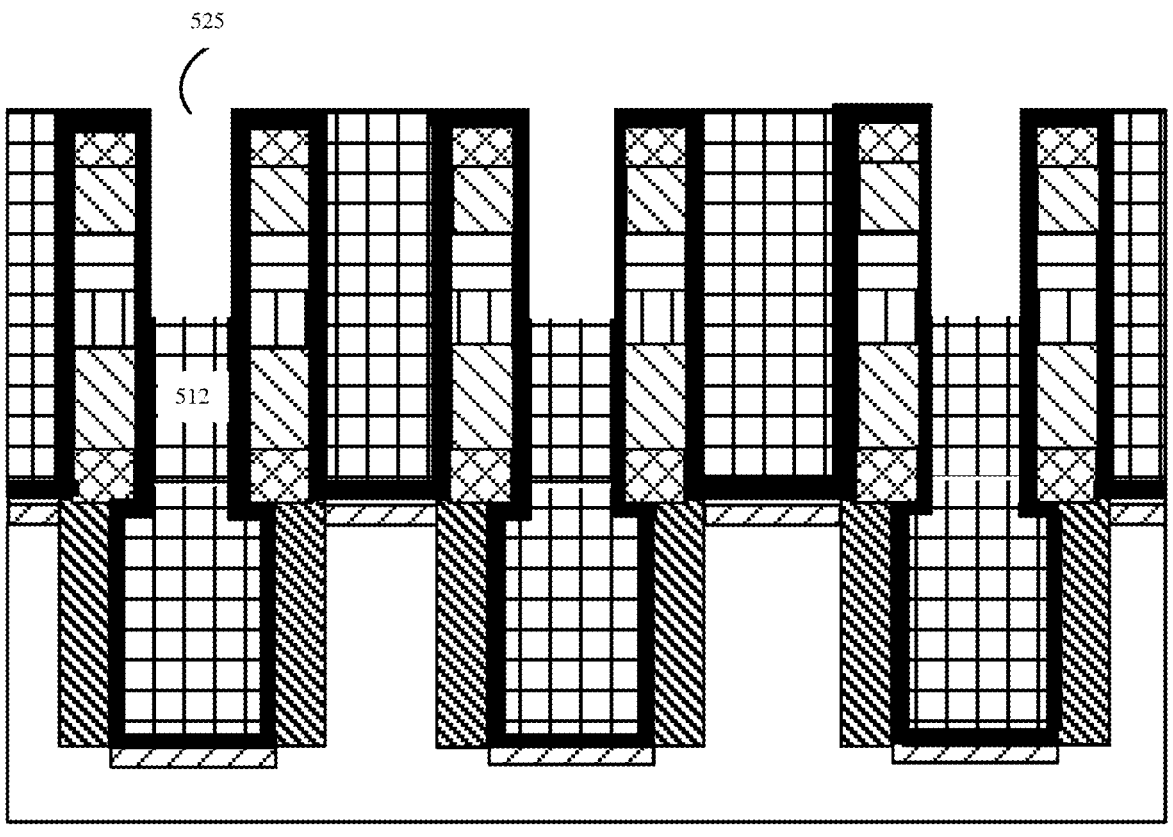
Figure 5T:
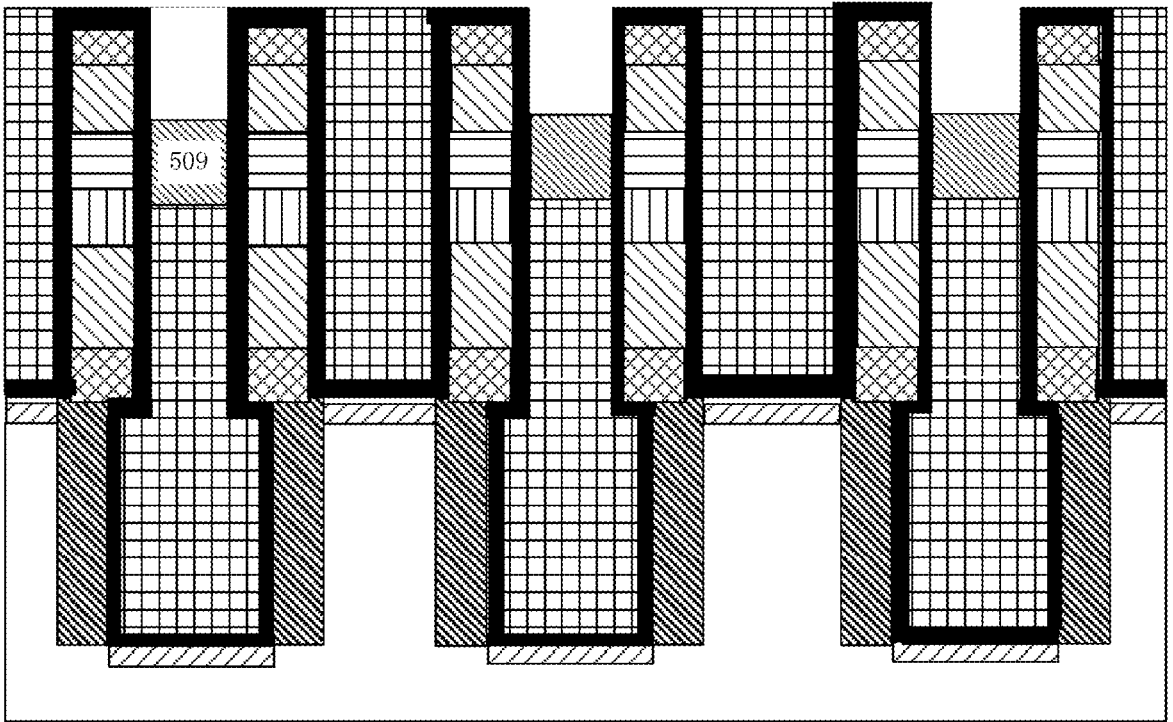
Figure 5U:
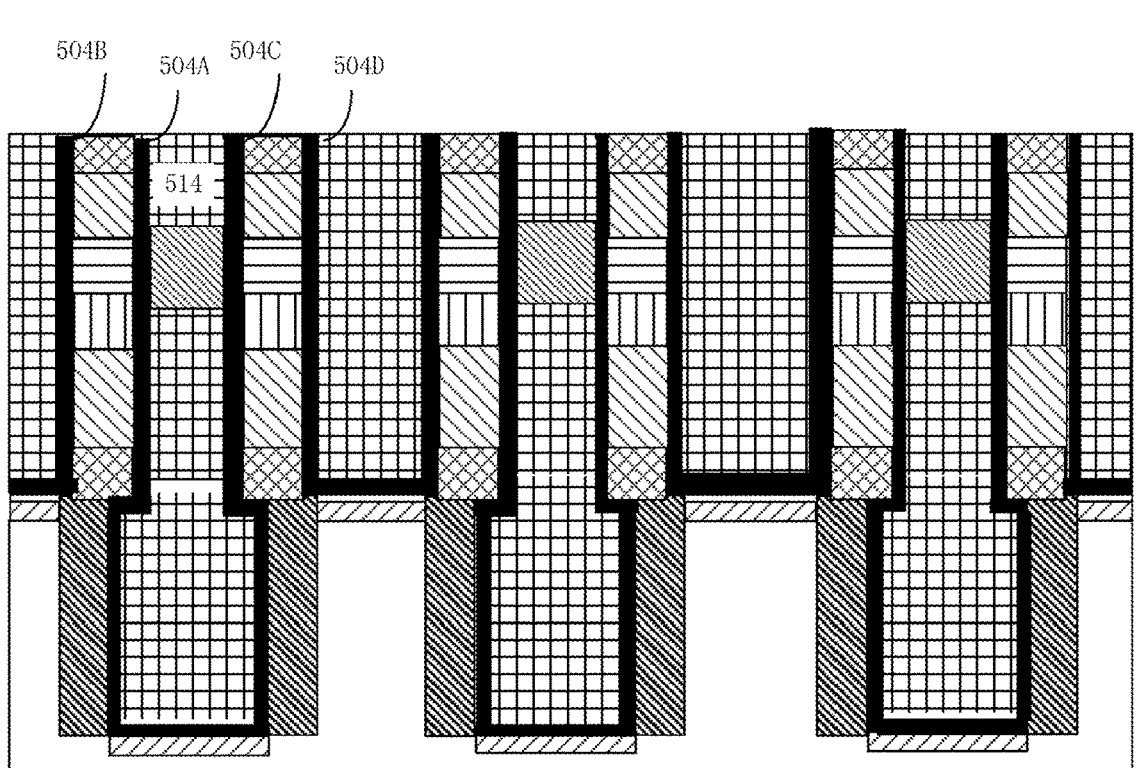
Figure 5V:
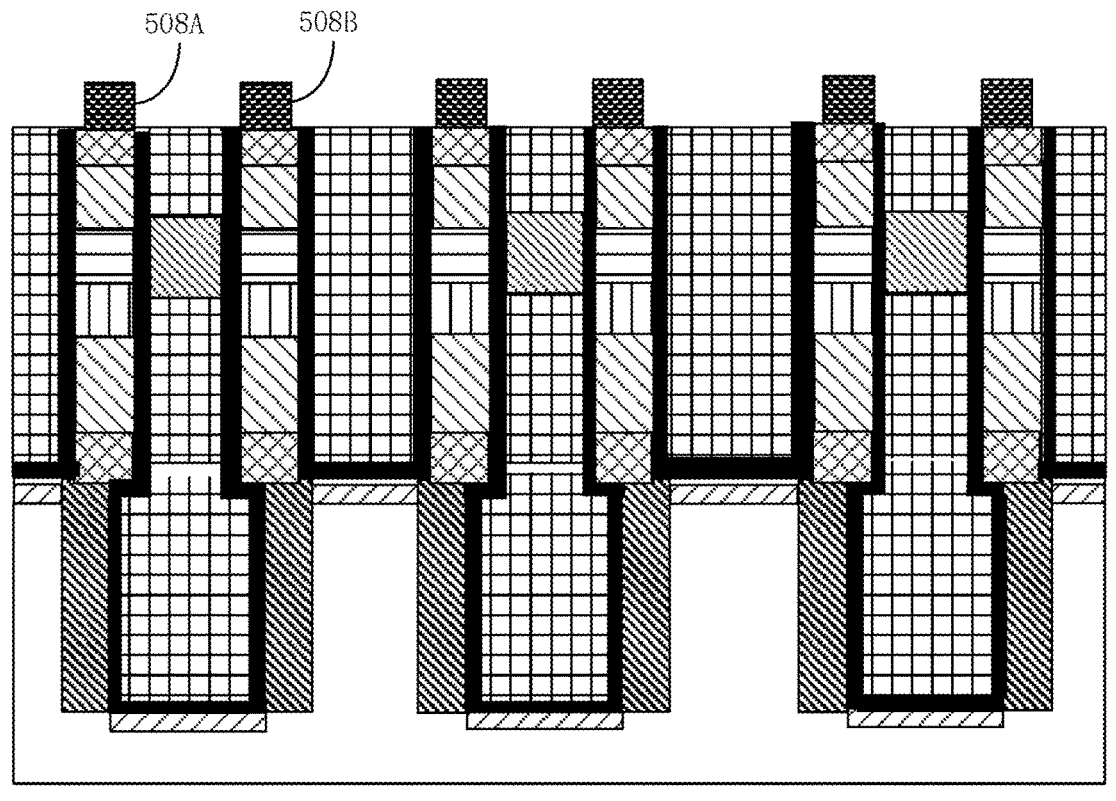
Figure 5W:
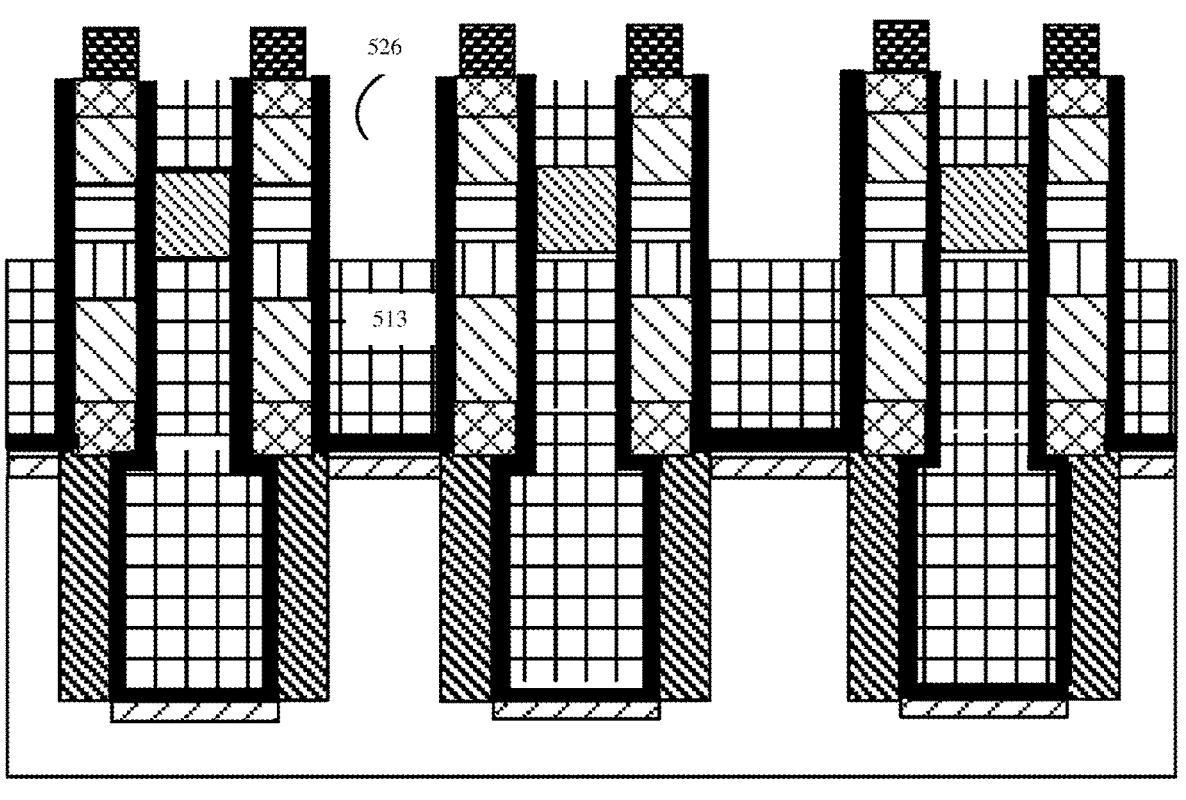
Figure 5X:
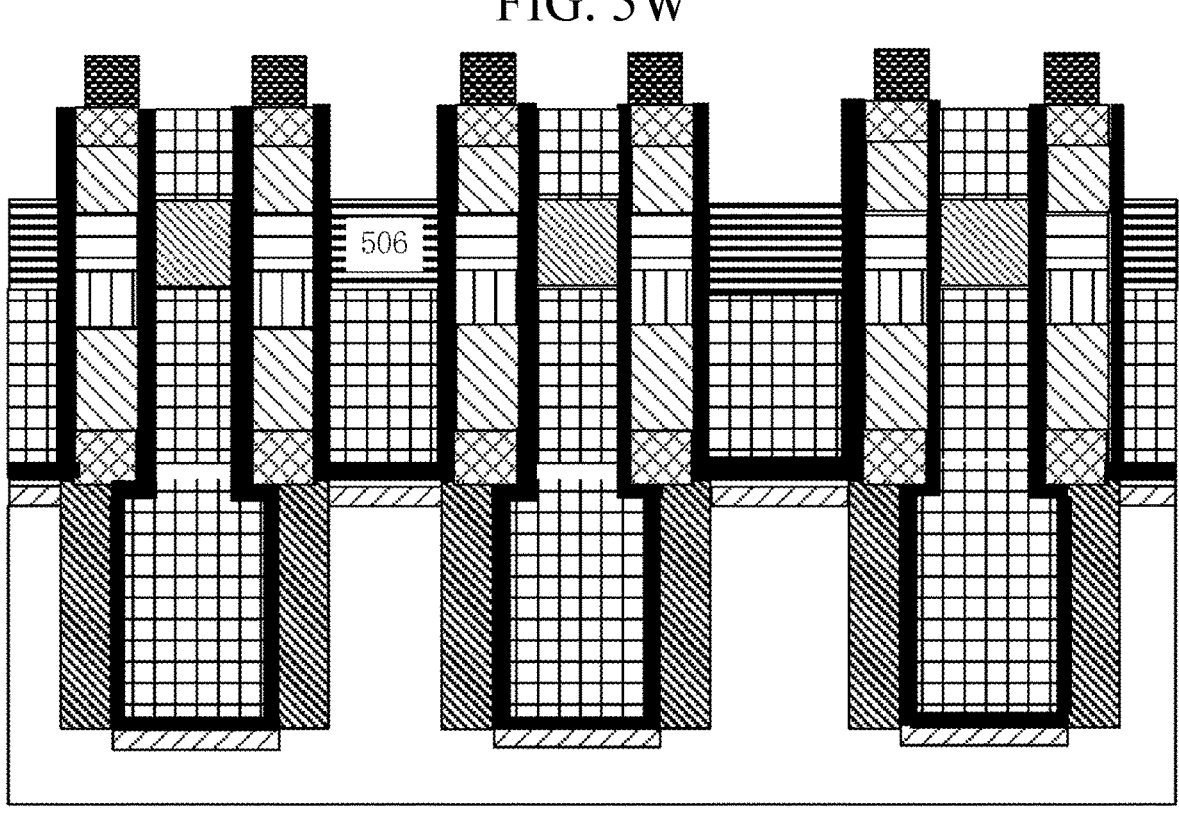
Figure 5Y:
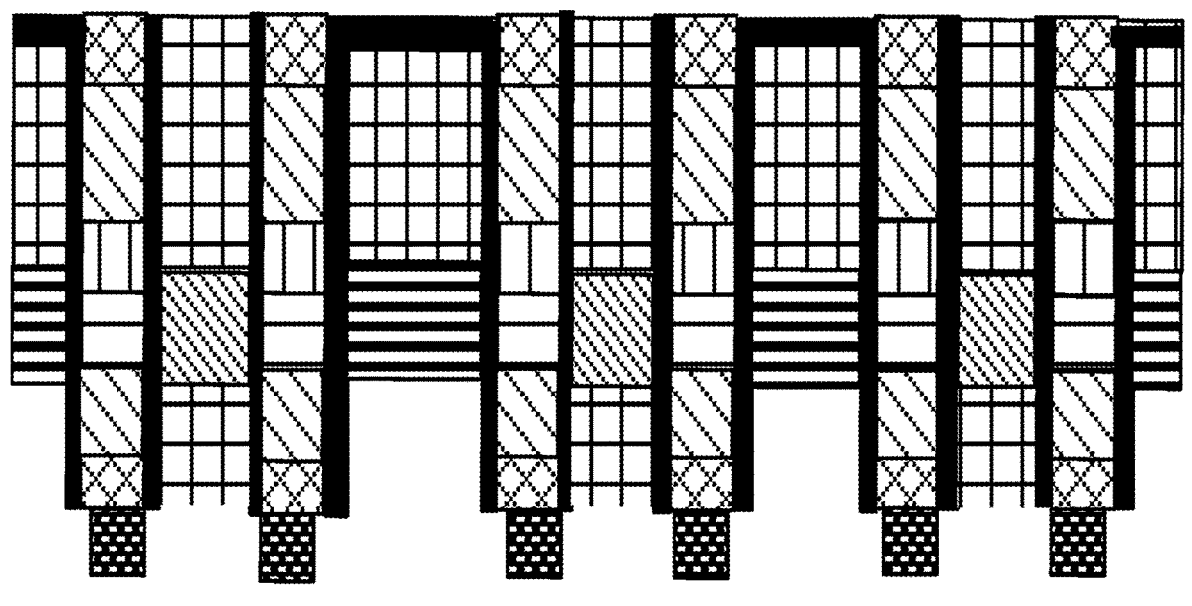
Figure 5Z:
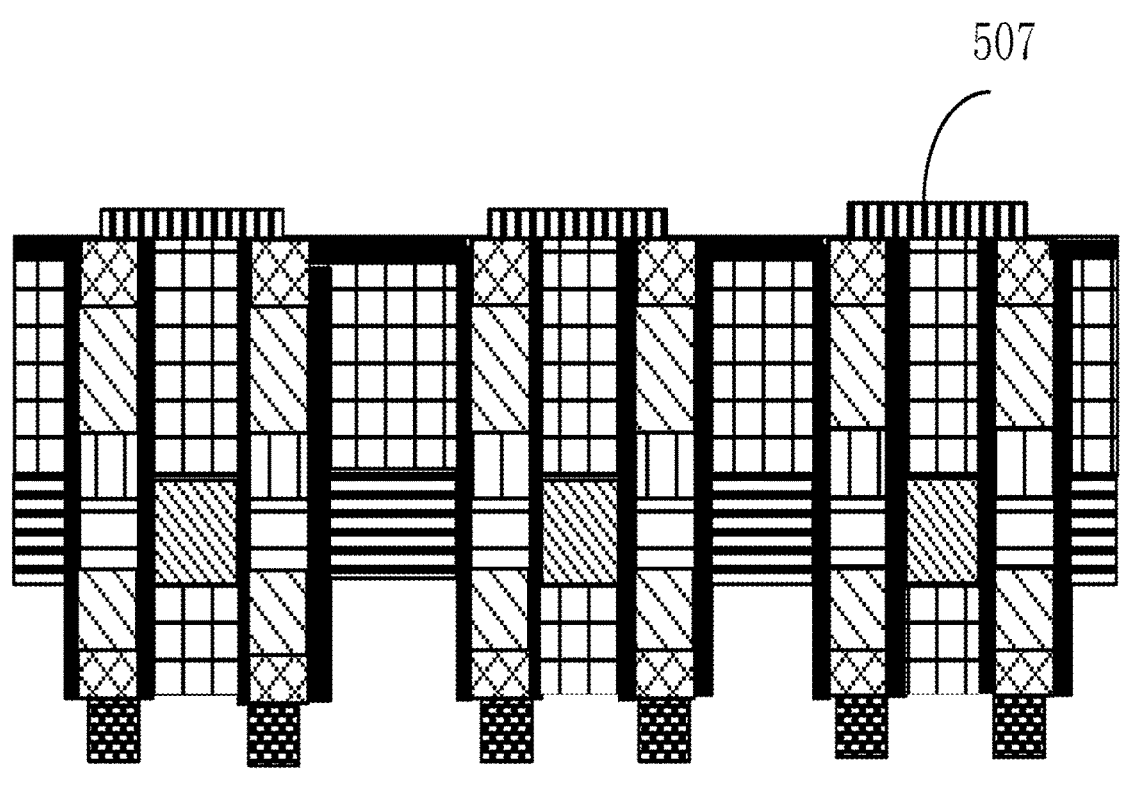

FIG. 5A to FIG. 5Z are schematic flowcharts of a manufacturing method for a dual-channel HEMT according to an embodiment of the present invention. In the present embodiment, a semiconductor device is manufactured on a silicon substrate. As understood by a person skilled in the art, other substrates such as GaN, $Al_2O_3$ (sapphire) and SiC also can implement a similar structure.

As shown in FIG. 5A to FIG. 5Z, a manufacturing method for a HEMT 500 includes: at step 5001, as shown in FIG. 5A, a Si substrate 501 is provided.

At step 5002, a plurality of first trenches are formed on the substrate, as shown in FIG. 5B. For example, the substrate 501 is etched by using a lithography technology to form a plurality of rectangular first trenches 521 on the substrate 501, and vertical interfaces 541 and 542 of the substrate 501 are exposed, where the substrate vertical interfaces 541 and 542 in the first trenches 521 are (111) surfaces of the Si substrate (i.e., crystal <0001> surfaces). The first trenches 521 may also be obtained by other modes in the art, and these methods can also be applied here.

In some embodiments, the number of the first trenches configured on a same substrate depends on specific requirements on an integration level, voltage withstanding and the like. The following take merely three trenches as an example for description. According the method involved in the present invention, the shape and size of the trenches can be configured in advance according to actual requirements, for example, when a semiconductor device having high voltage withstanding is formed, the depth of trenches is deep.

In some embodiments, when the exposed vertical interfaces are <000-1> surfaces, the HHMT as shown in FIG. 3 or FIG. 4 is formed. The details are not repeated here.

At step 5003, a protective layer is formed on the surfaces of the substrate and the first trenches on the substrate, as shown in FIG. 5C. A SiN protective layer 531 is grown on the substrate 501 by using technologies such as LPCVD, covering the surfaces of the substrate 501 and the plurality of trenches 521.

At step 5004, the protective layer horizontally extending on the bottoms of the first trenches and the upper surface of the substrate is removed, and the protective layers on sidewalls of the first trenches are reserved, as shown in FIG. 5D. By using the etching technology having a vertical alignment, only the protective layers 531 formed by SiN on the vertical interfaces 541 and 542 are reserved, and the Si substrate 501 on the bottoms of the trenches 521 is exposed. The protective layer 531 covers the substrate vertical interfaces 541 and 542 of the trenches 521 of the substrate.

At step 5005, first separation layers are formed on the substrate and the first trenches, as shown in FIG. 5E. The separation layers 511 cover the bottoms of the first trenches 521. In some embodiments, $SiO_2$ may be formed by an oxidation technology, such that the first separation layers 511 are formed on the substrate 501. Because the vertical interfaces 541 and 542 of the substrate 501 are covered with the protective layers 531, substantially no separation layer 511 is grown on the vertical interfaces 541 and 542 of the substrate 501.

At step 5006, the protective layers on the sidewalls of the trenches are removed, as shown in FIG. 5F. The separation layers 511 above the substrate 501 are covered by a mask, and then the protective layers 531 on the sidewalls of the first trenches 521 are partially etched by selectively using an etching technology, the lithography technology or other technologies. For example, the etching may include removing part of the sidewalls of the first trenches 521. After etching, the vertical interfaces 541 and 542 of the substrate 501 are exposed. There are other methods in the art for removing the protective layers and exposing the vertical interfaces of the substrate. These methods can also be applied here.

At step 5007, a first nucleation layer and a second nucleation layer are formed on the vertical interfaces, as shown in FIG. 5G. The first nucleation layer 502A and the second nucleation layer 502B are grown on the exposed vertical surfaces 541 and 542 of the substrate 501. The nucleation layers 502A and 502B includes AlN. In some embodiments, after AlN is formed, one or more buffer materials in AlN, GaN, AlGaN, InGaN, AlInN and AlGaInN are further grown. In some embodiments, while the nucleation layers extend and grow horizontally, the nucleation layers also grow vertically (not shown). By control process parameters, the nucleation layers are controlled to grow horizontally as much as possible. Although growing in vertical direction is present, the device structure is not affected.

In some embodiments, nitride semiconductor nucleation layers (a composite structure of AlN or AlN/AlGaN/GaN) are deposited, and because of low selectivity of Al growth, polycrystalline or amorphous AlN or AlGaN may exist on $SiO_2$. A wafer is taken out after the nucleation layers are formed, and the polycrystalline or amorphous AlN or AlGaN is removed by means of vertical etching.

At step 5008, a second separation layer is formed on the substrate of the entire device, as shown in FIG. 5H. On the structure as shown in FIG. 5G, a $SiO_2$ second separation layer 519 is formed by a deposition process. The trenches 521 are filled by the second separation layer 519, and the $SiO_2$ second separation layer 519 having a certain height is formed on the substrate. In some embodiments, if a semiconductor device having a greater aspect ratio is intended to be formed, the height of the second separation layer 519 is increased accordingly.

At step 5009, the second separation layer is patterned to form a plurality of second trenches, so as to expose part of the nucleation layers, as shown in FIG. 5I. By using the vertical etching technology, the second trenches 525 and 524 are vertically etched on the second separation layer 519. Basically, the second trenches 525 and 524 define the height of a second layer of the semiconductor device, that is, the overall height of the device after the device is formed. Moreover, the height of the nucleation layer is restricted to the first layer. The upper surfaces of the nucleation layers 502A and 502B are exposed on the bottoms of the trenches 523 and 524.

A person skilled in the art should note that the nucleation layers 502A and 502B are formed on the Si substrate (111) surface, and therefore, the nucleation layers 502A and 502B have hexagonal symmetry. After the upper surfaces of the nucleation layers 502A and 502B are exposed, other structures formed in the trenches 523 and 524 also have hexagonal symmetry.

At step 5010, first ohmic contact doped regions are grown in the plurality of second trenches, as shown in FIG. 5J. The nitride semiconductor and a doping medium are deposited on the nucleation layers 502A and 502B by means of chemical vapor doping, to form the first ohmic contact doped regions 531A and 531B. For a device implementing conduction by 2DEG, the doping type is N type. For a device implementing conduction by 2DHG, the doping type is P type. Because carriers in the 2DEG are electrons, N-type doping also implements conduction by electrons. Therefore, it can be considered that the doping type is the same as a two-dimensional carrier type. For conventional deposition or epitaxial growth, the growth condition thereof in the horizontal direction cannot be easily controlled, and therefore, it is difficult for the semiconductor structure to keep growing completely vertically, and a plurality of growth surfaces may be formed. The structure involved in the present invention can keep continuous growth on a same surface, and improve the electrical characteristics of the device.

At step 5011, first channel regions are formed on the first ohmic contact doped regions, as shown in FIG. 5K. The nitride semiconductor and a doping medium are deposited on the first ohmic contact doped regions 5331A and 531B by means of chemical vapor doping, to form the first channel region 532A and the third channel region 532B. Doping of the first channel region 532A and the third channel region 532B is low-doping or non-(intentional) doping, and the doping type is N type.

At step 5012, electric field modulation doped regions are formed on the first channel regions, as shown in FIG. 5L. The nitride semiconductor and a doping medium are deposited on the first channel region 532A and the third channel region 532B by means of chemical vapor doping, to form the electric field modulation doped regions 533A and 533B. Doping types of the electric field modulation doped regions 533A and 533B are P type.

At step 5013, gate stack doped regions are formed on the electric field modulation doped regions, as shown in FIG. 5M. The nitride semiconductor and a doping medium are introduced on the electric field modulation doped regions 533A and 533B by means of chemical vapor doping, to form the gate doped regions 534A and 534B. Doping types of the gate doped regions 534A and 534B are P type, and the doping concentrations of the gate doped regions 534A and 534B are higher than those of the electric field modulation doped regions 533A and 533B.

At step 5014, second channel regions are formed on the gate doped regions, as shown in FIG. 5N. The nitride semiconductor and a doping medium are introduced on the gate doped regions 534A and 534B by means of chemical vapor doping, to form the second channel region 535A and fourth channel regions 535B. Doping of the second channel region 535A and the fourth channel regions 535B is low-doping or non-(intentional) doping, and the doping type is N type.

At step 5015, second ohmic contact doped regions are formed on the second channel regions and the fourth channel regions, as shown in FIG. 5O. The nitride semiconductor and a doping medium are introduced on the second channel regions and the fourth channel regions 535A and 535B by means of chemical vapor doping, to form the second ohmic contact doped regions 536A and 536B. Doping types of the second ohmic contact doped regions 536A and 536B are N type.

At step 5016, the remaining second separation layer is removed, as shown in FIG. 5P. The remaining second separation layer 519 is removed by using the etching technology. After removal, the upper surfaces of the separation layers 511 are exposed, and a first channel layer and a second channel layer, except the positions in contact with the nucleation layers, are all exposed. The positions in contact with the first channel layers and the second channel layers and the sidewalls not in contact with the substrate on the upper surfaces of the nucleation layers are exposed.

At step 5017, a barrier layer is deposited, as shown in FIG. 5Q. The barrier layer 504 is deposited on the device, and the barrier layer covers the surface of the device. The barrier layer 504 is formed, where a first heterojunction and a second heterojunction both having a vertical interface are formed between the first channel layer and the first barrier layer, and vertical 2DEG 505A and 2DHG 505B are formed in the first heterojunction and the second heterojunction. Similarly, a third heterojunction and a fourth heterojunction both having a vertical interface are formed between the second channel layer and the first barrier layer, and vertical 2DEG 505C and 505D is formed in the third heterojunction and the fourth heterojunction. In some embodiments, a relatively thin non-doped channel layer is first deposited before the barrier layer is deposited, and the material of the channel layer is the same as that of the nitride semiconductor of the substrate of the original channel layer. This can ensure good contact between the barrier layer and the channel layer, and the electrical characteristics are more stable.

At step 5018, an insulating layer is deposited, as shown in FIG. 5R. The insulating layer 518 is deposited on the surface of the device, the insulating layer 518 covers the barrier layer 504, and finally the device becomes flatter.

At step 5019, the insulating layer is patterned, and third trenches are formed between the first channel layer and the second channel layer, as shown in FIG. 5S. In some embodiments, the insulating layer 518 is etched between the first channel layer and the second channel layer, to form third trenches 525, and moreover, the reserved insulating layer forms a shielding layer 512. The etching depth here needs to be ensured to be slightly lower than the contact surfaces between the gate doped surfaces and the electric field modulation doped regions, to ensure good contact between electrodes and the gate doped regions in a subsequent electrode formation process.

At step 5020, third electrodes are deposited, as shown in FIG. 5T. The third electrodes 509 are configured at the bottoms of the trenches 525, between first gate doped regions and second gate doped regions, and in electric contact with the 2DEG 505A and 505B in the first heterojunction. The third electrodes 509 are formed between the barrier layers by means of electrode deposition. To ensure full electric contact of the third electrodes 509 with the first gate doped regions and the second gate doped regions, the height of the electrodes 509 is slightly higher than the upper surfaces of the first gate doped regions and the second gate doped regions. In some embodiments, the electrodes 509 are positioned closer to an upper position as a gate. The electrodes 509, as a gate, being positioned as far away from a drain as possible improves the overall voltage withstanding of the device. In some embodiments, the electrodes 509 may be two electrodes respectively controlling the first channel layer and the second channel layer. The process in the solution of the present embodiment is simpler.

At step 5021, a third separation layer is deposited, and then the upper surfaces of the first channel layer and the second channel layer are exposed, as shown in FIG. 5U. The third separation layer 514 is formed on the entire device again. SiO$_2$ is deposited on the semiconductor device by using a deposition process, to make SiO$_2$ fill the part above electrodes 507 and cover the channel layers and the barrier layers, thereby forming the third separation layer 514. Then, part of the barrier layer 504 is removed by using a lithography process to expose the upper surfaces of the first channel layer and the second channel layer. At this time, the barrier layer 504, which is originally as a whole, is separated into a first barrier layer 504A, a second barrier layer 504B, a third barrier layer 504C and a fourth barrier layer 504D.

At step 5022, second electrodes are deposited, as shown in FIG. 5V. The second electrodes 508A and 508B are formed by using the electrode deposition method at positions on the upper surfaces of the first channel layer and the second channel layer and close to the 2DEG 505A and 505B. The second electrodes 508A and 508B are in ohmic contact with the second ohmic contact doped regions, and electrically connected to the 2DEG 505A and 505C. Moreover, the second electrodes 508A and 508B are not electrically connected to the 2DHG 505B and 505D. In some embodiments, the second electrodes 508A and 508B serve as a source of the device. In some embodiments, the second electrodes 508A and 508B are connected to a low level, e.g., 0 V.

In some embodiments, the second electrodes 508A and 508B may also be a same electrode.

At step 5023, the insulating layer close to the second barrier layer and the fourth barrier layer is patterned, as shown in FIG. 5W. By using the vertical etching technology, part of the insulating layer 518 of the second barrier layer and the fourth barrier layer is etched to form trenches 526. Meanwhile, an insulating layer 513 is formed. The etching depth here needs to be ensured to be slightly lower than the contact surfaces between the gate doped surfaces and the electric field modulation doped regions, to ensure good contact between electrodes and the gate doped regions in a subsequent electrode formation process.

At step 5024, fourth electrodes are deposited, as shown in FIG. 5X. The fourth electrodes 506 are configured at the bottoms of the trenches 526, between the first gate doped regions and the second gate doped regions, and in electric contact with the 2DHG 505B and 505D in the first heterojunction. The fourth electrodes 506 are formed between the barrier layers by means of electrode deposition. To ensure full electric contact of the fourth electrodes 506 with the first gate doped regions and the second gate doped regions, the height of the electrodes 506 is slightly higher than the upper surfaces of the first gate doped regions and the second gate doped regions. In some embodiments, the electrodes 506 are configured, as body electrodes, at positions having the same height of the electrodes 509. In some embodiments, the electrodes 506 may be two electrodes respectively controlling the first channel layer and the second channel layer. The process in the solution of the present embodiment is simpler. The fourth electrodes in direct ohmic contact with the 2DHG may also be formed, and moreover, the fourth electrodes are electrically connected to the gate doped regions by means of the 2DHG.

At step 5025, the entire semiconductor device is turned over, and the substrate and the nucleation layers are removed, as shown in FIG. 5Y. As shown in FIG. 5Y, after the semiconductor device is turned over, the substrate 501 is oriented upwards. The substrate 501 is first thinned, and then, by means of wet etching, the entire substrate 501 and the nucleation layers 502A and 502B are removed from the semiconductor device. The upper surfaces of the first channel layer and the second channel layer are exposed.

At step 5026, first electrodes are deposited, as shown in FIG. 5Z. By means of metal deposition, metal electrodes, i.e., the first electrodes 507, are formed on the first channel layer and the second channel layer. The first electrodes 507 are electrically connected to both the 2DEG 505A and 505C in the first heterojunction and the third heterojunction, but are not electrically connected to the 2DHG 505B and 505D.

In some embodiments, the subsequent steps includes forming a first conductor interconnecting layer, a second conductor interconnecting layer and a third conductor interconnecting layer, which are electrically connected to the first electrodes, the second electrodes and the third electrodes, respectively. These steps are all well known by a person skilled in the art and is not repeated here.

The channel layers of the HEMT formed by the foregoing method have relatively high aspect ratios. Moreover, the device is normally off in a non-energized state.

The foregoing structure of the present invention merely exemplarily describes the technical solution of the present invention. In some embodiments, a same trench may include more semiconductor structures, thereby achieving a solution having a higher integration level. For example, when the HHMT is formed, it is merely required to adjust the crystal orientation of the vertical interfaces of the substrate and the doping types in various regions in the channel layers.

The above-described embodiments are merely illustrative of the present invention, and are not intended to limit the present invention. Various changes and modifications may also be made by persons of ordinary skill in the art without departing from the scope of the present invention. Therefore, all the equivalent technical solutions should also fall within the scope of the present invention.

The invention claimed is:

1. A semiconductor device, comprising:

a first channel layer, which comprises a first channel region, a first gate doped region, and a second channel region, wherein the second channel region is located above the first channel region, and the first gate doped region is located between the first channel region and the second channel region;

a first barrier layer, wherein a first heterojunction having a vertical interface is formed between the first channel layer and the first barrier layer, and a vertical 2DEG or 2DHG is formed in the first heterojunction;

a first electrode, which is located below the first gate doped region and in electric contact with the 2DEG or 2DHG in the first heterojunction;

a second electrode, which is located above the first gate doped region and in electric contact with the 2DEG or 2DHG in the first heterojunction; and a third electrode, which is in electric contact, in the first gate doped region, with the 2DEG or 2DHG in the first heterojunction;

a second channel layer, which comprises a third channel region, a second gate doped region, and a fourth channel region, wherein the fourth channel region is located above the third channel region, and the second gate doped region is located between the third channel region and the fourth channel region;

a third barrier layer, wherein a third heterojunction having a vertical interface is formed between the second channel layer and the third barrier layer, and a vertical 2DEG or 2DHG is formed in the third heterojunction;

a fifth electrode, which is located below the second gate doped region and in electric contact with the 2DEG or 2DHG in the third heterojunction; and a sixth electrode, which is located above the second gate doped region and in electric contact with the 2DEG or 2DHG in the third heterojunction; wherein the third electrode is in electric contact, in the second gate doped region, with the 2DEG or 2DHG in the third heterojunction.

2. The semiconductor device according to claim 1, wherein a doping type of the first gate doped region is opposite to a two-dimensional carrier type in the first heterojunction.

3. The semiconductor device according to claim 1, wherein the first gate doped region depletes two-dimensional carriers in the first heterojunction.

4. The semiconductor device according to claim 1, wherein the first channel layer comprises a first electric field modulation doped region, wherein the first electric field modulation doped region is electrically connected to the first gate doped region.

5. The semiconductor device according to claim 4, wherein the first electric field modulation doped region is located near the third electrode.

6. The semiconductor device according to claim 4, wherein the first electric field modulation doped region is located between the first electrode and the third electrode.

7. The semiconductor device according to claim 1, wherein the first channel region of the first channel layer is lowly doped or substantially non-doped.

8. The semiconductor device according to claim 1, wherein the first channel region of the second channel layer is lowly doped or substantially non-doped.

9. The semiconductor device according to claim 1, wherein the first channel layer comprises a first ohmic contact doped region adjacent to the first electrode.

10. The semiconductor device according to claim 1, wherein the first channel layer comprises a second ohmic contact doped region adjacent to the second electrode.

11. The semiconductor device according to claim 1, further comprising a second barrier layer, wherein a second heterojunction having a vertical interface is formed between the first channel layer and the second barrier layer, and a vertical 2DEG or 2DHG is formed in the second heterojunction.

12. The semiconductor device according to claim 11, further comprising a fourth electrode, which is in electric contact with the first gate doped region.

13. The semiconductor device according to claim 12, wherein the fourth electrode independently controls or is electrically connected to the first electrode.

14. The semiconductor device according to claim 12, wherein the second barrier layer is located below the fourth electrode.

15. The semiconductor device according to claim 1, further comprising a first nucleation layer, wherein the first channel layer is epitaxially grown from the first nucleation layer.

16. The semiconductor device according to claim 15, wherein the first channel layer is located above the first nucleation layer.

17. The semiconductor device according to claim 15, wherein the first nucleation layer is doped.

18. The semiconductor device according to claim 15, wherein the first nucleation layer is epitaxially grown from a first vertical interface of a substrate.

19. The semiconductor device according to claim 1, wherein the first channel layer is defined by a trench.

20. The semiconductor device according to claim 1, wherein the first electrode is connected to a first external voltage below the first heterojunction, and the second electrode is connected to a second external voltage above the first heterojunction.

21. The semiconductor device according to claim 1, wherein the first electrode and the fifth electrode are a same electrode.

22. The semiconductor device according to claim 1, wherein the second electrode and the sixth electrode are a same electrode.

23. The semiconductor device according to claim 1, wherein the second channel layer comprises a second electric field modulation doped region, wherein the second electric field modulation doped region is electrically connected to the second gate doped region.

24. The semiconductor device according to claim 1, further comprising a fourth barrier layer, wherein a fourth heterojunction having a vertical interface is formed between the second channel layer and the fourth barrier layer, and a vertical 2DEG or 2DHG is formed in the fourth heterojunction.

25. The semiconductor device according to claim 23, further comprising a seventh electrode, which is in electric contact, in the second gate doped region, with the 2DEG or 2DHG in the fourth heterojunction.

26. The semiconductor device according to claim 24, wherein the seventh electrode independently controls or is electrically connected to the fifth electrode.

27. The semiconductor device according to claim 1, further comprising a second nucleation layer, wherein the second channel layer is epitaxially grown from the second nucleation layer.

28. The semiconductor device according to claim 26, wherein the second nucleation layer is epitaxially grown from a second vertical interface of a substrate.

29. The semiconductor device according to claim 1, further comprising a foreign substrate.

* * * * *